(12) United States Patent
Arai et al.

(10) Patent No.: US 8,976,438 B2
(45) Date of Patent: Mar. 10, 2015

(54) DISPLAY AND ELECTRONIC UNIT

(75) Inventors: Toshiaki Arai, Kanagawa (JP); Yoshihiro Oshima, Kanagawa (JP)

(73) Assignee: Sony Corporation (JP)

( * ) Notice: Subject to any disclaimer, the term of this patent is extended or adjusted under 35 U.S.C. 154(b) by 235 days.

(21) Appl. No.: 13/493,624

(22) Filed: Jun. 11, 2012

(65) Prior Publication Data
US 2012/0327498 A1    Dec. 27, 2012

(30) Foreign Application Priority Data

Jun. 21, 2011 (JP) ................. 2011-136929

(51) Int. Cl.
| G02F 1/153 | (2006.01) |
| G02F 1/01 | (2006.01) |
| G02B 26/00 | (2006.01) |
| H05B 33/08 | (2006.01) |
| H01L 51/52 | (2006.01) |
| H01L 27/32 | (2006.01) |
| H01L 27/12 | (2006.01) |

(52) U.S. Cl.
CPC ........ H05B 33/0857 (2013.01); H01L 51/5284 (2013.01); H01L 27/3232 (2013.01); H01L 27/3262 (2013.01); H01L 27/3265 (2013.01); H01L 2251/5323 (2013.01); H01L 27/1225 (2013.01)
USPC .................. 359/267; 359/238; 359/290

(58) Field of Classification Search
USPC .......................... 359/238, 267, 290
See application file for complete search history.

(56) References Cited

U.S. PATENT DOCUMENTS

2004/0263460 A1* 12/2004 Lu .................................. 345/98

OTHER PUBLICATIONS

DH Cho et. al., "Al and Sn-doped Zinc Indium Oxide Thin film Transistors for AMOLED Back-Plane," Proceedings of the Society for Information Display, 2009 (SID2009), pp. 280-283. (4 pages).

* cited by examiner

Primary Examiner — Jack Dinh
(74) Attorney, Agent, or Firm — Sheridan Ross P.C.

(57) ABSTRACT

There are provided a display and an electronic unit capable of enhancing visibility. The display includes: a plurality of pixels each including a light-emission device, and having a light-transmission region in at least a part thereof; and one or more transmittance control devices capable of controlling a transmittance of incident light.

20 Claims, 22 Drawing Sheets

AT LIGHT-EMISSION TIME

AT NON-LIGHT-EMISSION TIME

AT LIGHT-EMISSION TIME (LIGHT TRANSMISSION STATE)

AT NON-LIGHT-EMISSION STATE (LIGHT ABSORPTION STATE)

AT NON-LIGHT-EMISSION STATE (LIGHT-ABSORPTION STATE)

AT LIGHT-EMISSION TIME (LIGHT TRANSMISSION STATE)

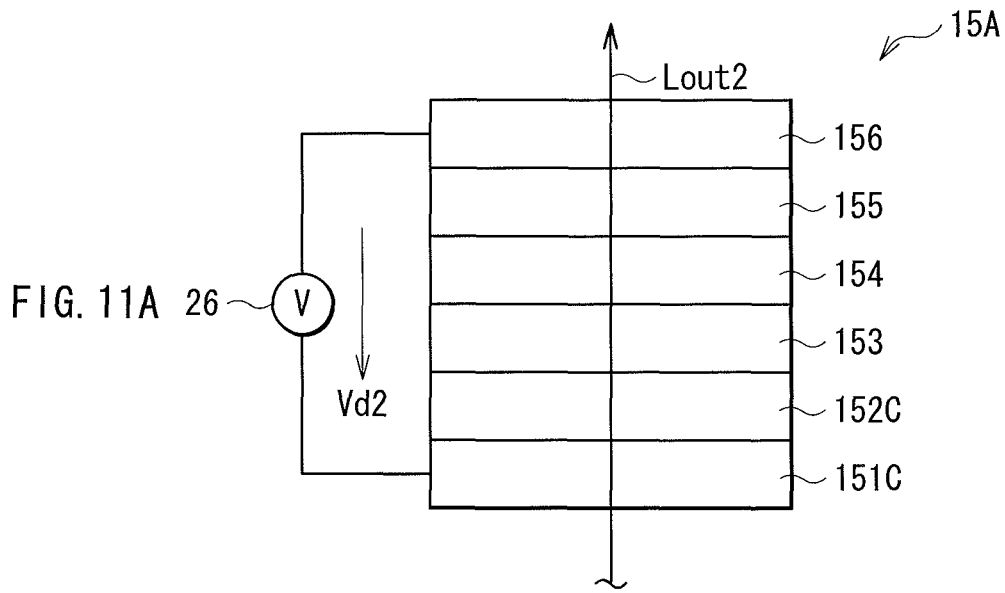
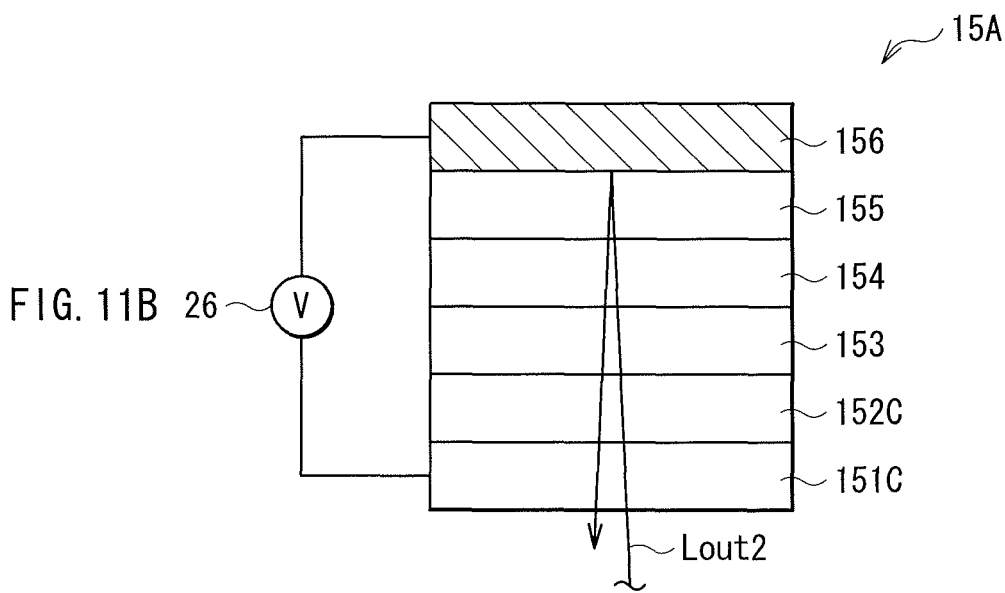

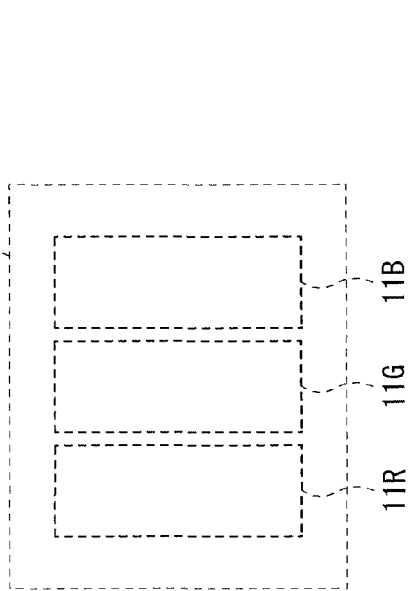
FIG. 12A
AT LIGHT-EMISSION STATE (LIGHT TRANSMISSION STATE)
FIG. 12B
AT NON-LIGHT-EMISSION STATE (LIGHT ABSORPTION STATE)
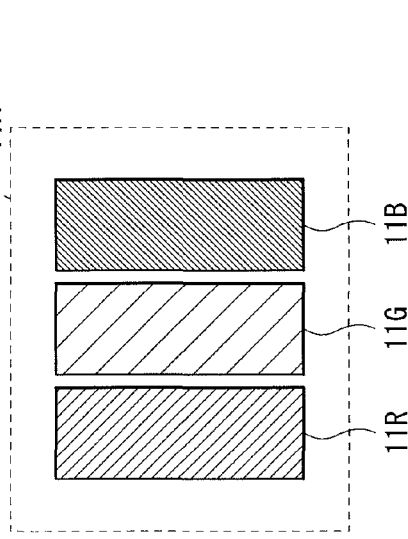
FIG. 12C
AT NON-LIGHT-EMISSION STATE (LIGHT REFLECTION STATE)
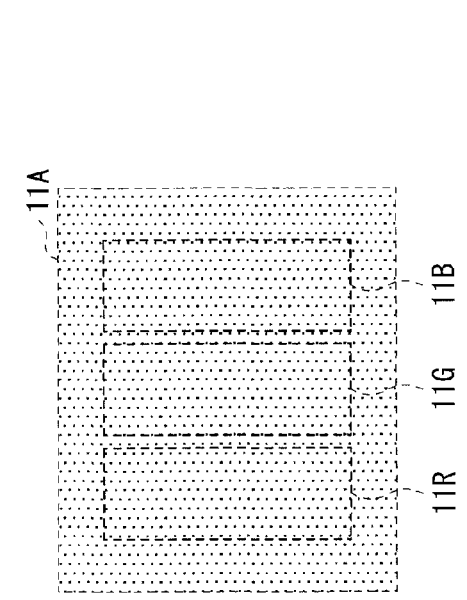
FIG. 12D
AT LIGHT-EMISSION TIME (LIGHT REFLECTION STATE)

AT LIGHT-EMISSION TIME (LIGHT TRANSMISSION STATE)

AT NON-LIGHT-EMISSION STATE (LIGHT ABSORPTION STATE)

AT NON-LIGHT-EMISSION STATE
(LIGHT ABSORPTION OR LIGHT REFLECTION STATE)

AT LIGHT-EMISSION TIME
(LIGHT ABSORPTION OR LIGHT REFLECTION STATE)

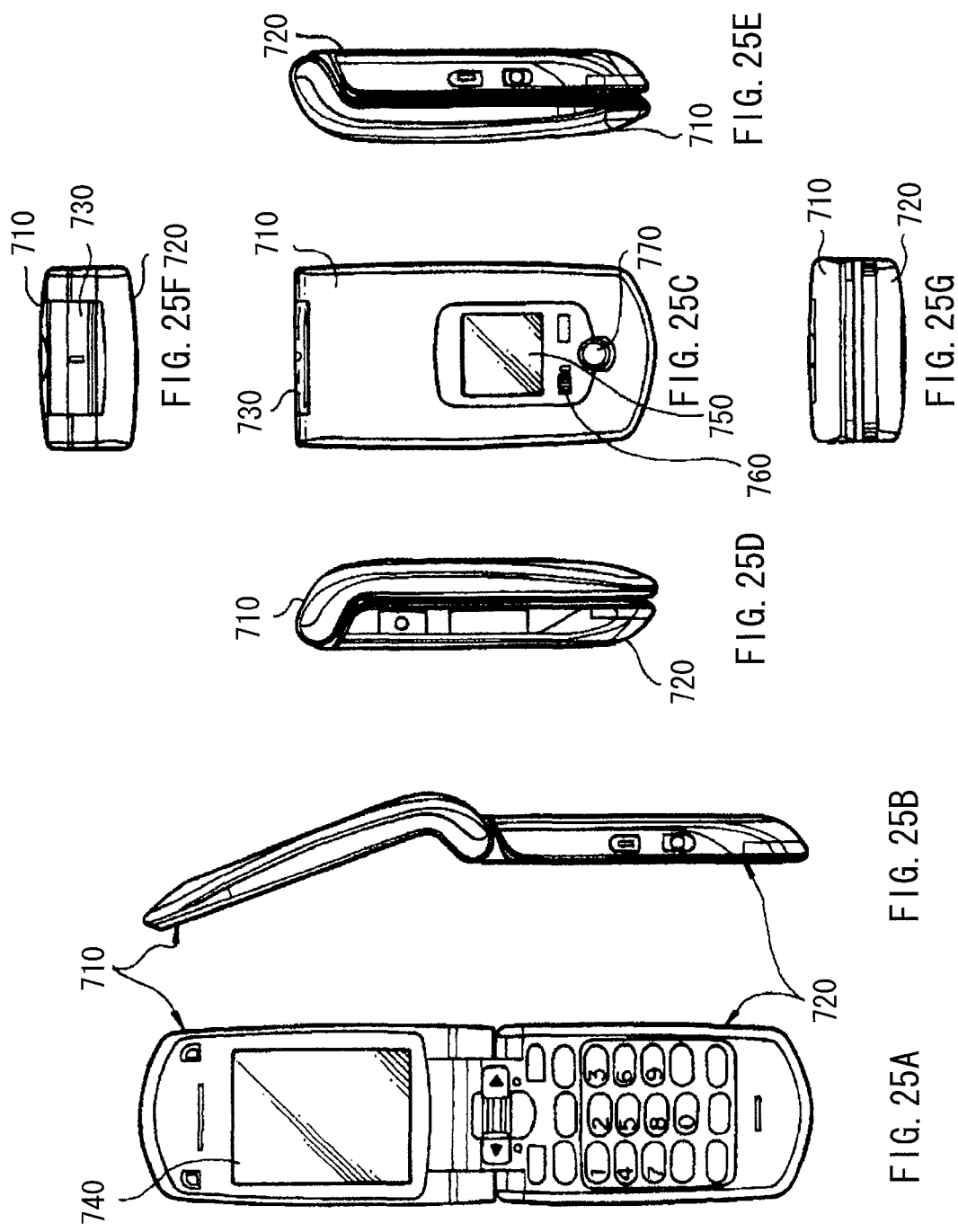

DISPLAY AND ELECTRONIC UNIT

CROSS REFERENCES TO RELATED APPLICATIONS

The present application claims priority to Japanese Priority Patent Application JP 2011-136929 filed in the Japan Patent Office on Jun. 21, 2011, the entire content of which is hereby incorporated by reference.

BACKGROUND

The disclosure relates to a display having a light-emission device, and an electronic unit provided with such a display.

In recent years, AR (Augmented Reality) technology has been studied actively. The AR technology is characterized by presenting a synthesized virtual object as additional information (electronic information) for (a part of) a real environment. The AR technology is a contrast to virtual reality. In the AR technology, explanation or related information about a specific object in a real environment is included and presented in proximity to the actual object targeted for the explanation or related information. Therefore, a technique of acquiring information on a real environment such as a position where a user observes an object, which is a technique used to realize AR, is considered to be important as a basic technique.

Meanwhile, in recent years, electronic units with relatively large displays, which are called a smartphone or a tablet, have been commercialized. After being taken by an image pickup device (a camera) mounted on such an electronic unit, an image of a real environment is displayed on the display, and a virtual object is superimposed and displayed on a screen of the display. AR is thus readily realized with these electronic units.

One of examples of a technique that enhances reality (presence) in AR is a display (with pixels each having a light-transmission region) whose back-surface side is visually recognizable (a so-called transparent display). In this transparent display, it is possible to recognize an actual real environment visually through the display, instead of an image taken by an image pickup device like the one described above. For this reason, it is possible to realize AR with higher presence, by displaying electronic information about the real environment on the display.

One of examples of such a transparent display is an organic electroluminescence (EL) display using the following transparent materials (light transmissive materials) as a semiconductor material and a wiring material (see, for example, "Al and Sn-doped Zinc Indium Oxide Thin film Transistors for AMOLED Back-Plane", SID2009 proceedings, p. 280-283, by Doo-Hee Cho et al.). In this organic EL display, for instance, an oxide semiconductor (for example, Zn (zinc)-In (indium)-O (oxygen) to which aluminum (Al) and tin (Sn)) are added) is used as the semiconductor material, in a thin-film transistor (TFT). As the wiring material, ITO (Indium Tin Oxide) is used.

SUMMARY

Here, when such a transparent display is used as the display for AR as described above, improvement of visibility is desired so as to enhance the presence further.

It is desirable to provide a display and an electronic unit capable of enhancing visibility.

According to an embodiment of the disclosure, there is provided a display including: a plurality of pixels each including a light-emission device, and having a light-transmission region in at least a part thereof; and one or more transmittance control devices capable of controlling a transmittance of incident light.

According to an embodiment of the disclosure, there is provided an electronic unit including a display, the display including: a plurality of pixels each including a light-emission device, and having a light-transmission region in at least a part thereof; and one or more transmittance control devices capable of controlling a transmittance of incident light.

In the display and the electronic unit according to the above-described embodiments of the disclosure, the transmittance control device capable of controlling the transmittance of the incident light is provided. Therefore, there is realized control of the light transmittance to be appropriate to a light emission state (at the time of light emission or at the time of non-light emission) in the light-emission device in the pixel having the light-transmission region.

According to the display and the electronic unit in the above-described embodiments of the disclosure, the transmittance control device capable of controlling the transmittance of the incident light is provided. Therefore, controlling the light-transmittance to be appropriate to the light emission state in the light-emission device in the pixel having the light-transmission region is realized. Hence, visibility in the display with the pixels each having the light-transmission region is enhanced.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 11A and 11B are schematic diagrams for description of a light transmission state and a light reflection state, respectively, in a transmittance control device illustrated in FIG. 10.

FIGS. 12A to 12D are plan views schematically illustrating visual recognition states at the time of light emission and at the time of non-light emission, in a pixel of the second embodiment.

FIGS. 25A to 25G are views of an application example 5, namely, a front view in an open state, a side view in the open state, a front view in a closed state, a left-side view, a right-side view, a top view, and a bottom view, respectively.

DETAILED DESCRIPTION

Embodiments of the disclosure will be described below in detail with reference to the drawings. It is to be noted that the description will be provided in the following order.
1. First embodiment (an example using an electrochromic device that performs transmission and absorption of light)
2. Second embodiment (an example using an electrochromic device that performs transmission and reflection of light)
3. Third embodiment (an example using an electrowetting device)
4. Modifications common to the first to third embodiments
   Modification 1 (an example in which a transmittance control device is disposed for every horizontal line)
   Modification 2 (an example in which a transmittance control device is disposed for every subpixel (pixel))
   Modifications 3 and 4 (examples in each of which a transmittance control device is disposed side by side with each subpixel)
5. Module and application examples
6. Other modifications First Embodiment

Figure 1:
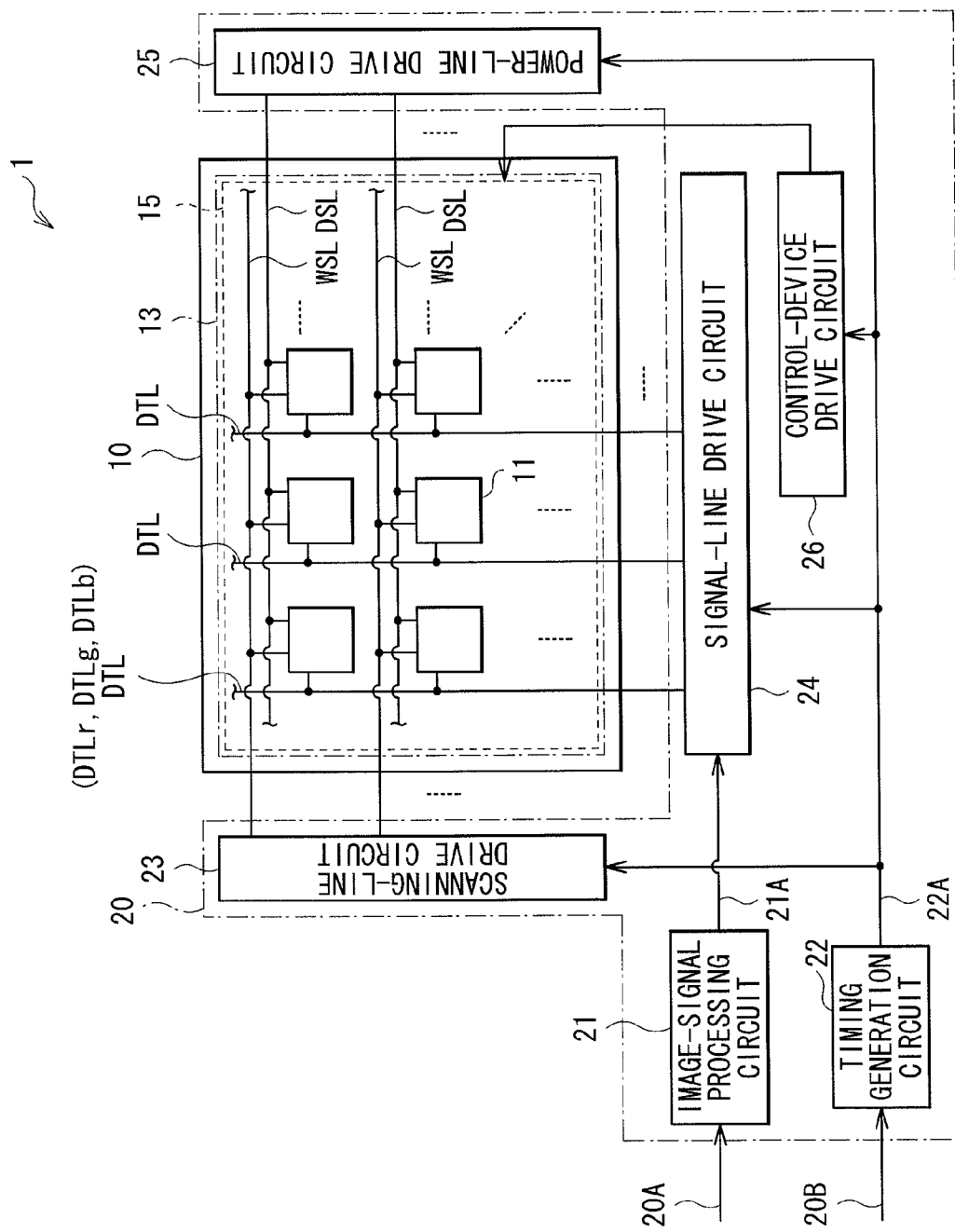
FIG. 1 is a block diagram illustrating an example of a display according to a first embodiment of the disclosure.

[Configuration of Display 1]
FIG. 1 is a block diagram illustrating a schematic configuration of a display (a display 1) according to a first embodiment of the disclosure. This display 1 includes a display panel 10 (a display section) and a drive circuit 20 (a drive section). In the display 1, at least a part of a pixel is a light-transmission region (a transparent region), thereby allowing visual recognition of a back-surface side (the display functions as a so-called transparent display), as will be described later.
(Display Panel 10)
The display panel 10 includes a pixel array section 13 with a plurality of pixels 11 arranged in a matrix, and displays an image by performing active matrix driving based on an image signal 20A and a synchronization signal 20B inputted from outside. Each of the pixels 11 is configured to include a plurality of subpixels corresponding to a plurality of (here, three) colors (i.e., subpixels for the respective colors), as will be described later.

The pixel array section 13 includes a plurality of scanning lines WSL arranged in rows, a plurality of signal lines DTL arranged in columns, and a plurality of power lines DSL arranged in rows along the scanning lines WSL. One end of each of the scanning line WSL, the signal line DTL, and the power line DSL is connected to the drive circuit 20 which will be described later. Further, each of the pixels 11 arranged in rows and columns (arranged in the matrix) is disposed corresponding to an intersection of each of the scanning lines WSL and each of the signal lines DTL. It is to be noted that, in FIG. 1, a plurality of signal lines DTLr, DTLg, and DTLb corresponding to a plurality of colors (i.e., signal lines for the respective colors) which will be described below are simplified and illustrated as each one of the signal lines DTL.

Further, on almost the entire surface of the pixel array section 13, a transmittance control device 15 capable of controlling a transmittance of incident light (a light transmittance) is disposed. In other words, the only one transmittance control device 15 common to all the pixels 11 within the pixel array section 13 is provided here. To be more specific, the resolution of the transmittance control device 15 is lower than the resolution of the pixels 11 (i.e. the transmittance control device 15 is disposed for every plurality of the pixels 11 (here, for all the pixels 11)). Furthermore, in the present embodiment, the transmittance control device 15 is disposed (arranged like a layer) to face each of the pixels 11 (each of organic EL devices 12 which will be described later). Here, the transmittance control device 15 is capable of switching operation between incident-light transmission operation and incident-light absorption operation. Specifically, the transmittance control device 15 is allowed to switch the operation between the transmission operation and the absorption operation, at the time of each of light emission and non-light emission (extinction) of the organic EL device 12 which will be described later. Here, the transmittance control device 15 is an electrochromic (EC) device which will be described later.

Figure 2:
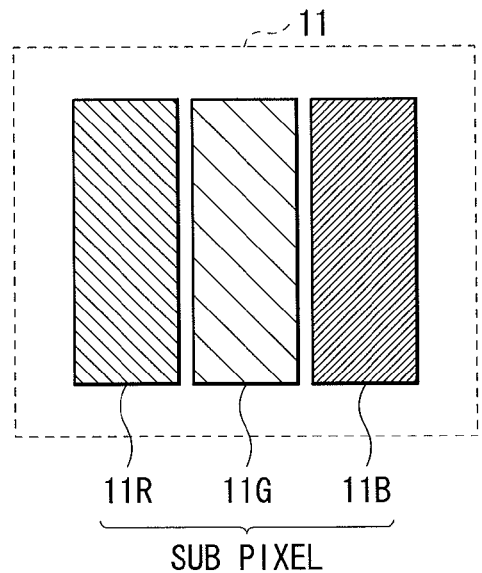
FIG. 2 is a schematic diagram illustrating a subpixel configuration example in each of pixels illustrated in FIG. 1.

FIG. 2 schematically illustrates an example of an internal configuration (a subpixel configuration) of each of the pixels 11, in a plan view.

Each of the pixels 11 is configured to include trichromatic subpixels 11R, 11G, and 11B of red (R), green (G), and blue (B). In other words, each of the pixels 11 has a subpixel configuration including the three subpixels 11R, 11G, and 11B corresponding to three colors of R, G, and B. Here, the three subpixels 11R, 11G, and 11B are arranged in a line along a horizontal-line direction (an H-line direction) in each of the pixels 11. However, the arrangement configuration of the subpixels 11R, 11G, and 11B in each of the pixels 11 is not limited to this example, and may be other arrangement configuration.

It is to be noted that although not illustrated in FIG. 2, the signal line DTLr, the scanning line WSL, and the power line DSL are connected to the subpixel 11R. Similarly, the signal line DTLb, the scanning line WSL, and the power line DSL are connected to the subpixel 11B. Also, the signal line DTLg, the scanning line WSL, and the power line DSL are connected to the subpixel 11G. In other words, the signal lines DTLr, DTLg, and DTLb corresponding to the respective colors are connected to the subpixels 11R, 11G, and 11B, respectively, whereas each of the scanning line WSL and the power line DSL is connected to the subpixels 11R, 11G, and 11B as a common line.

Figure 3:
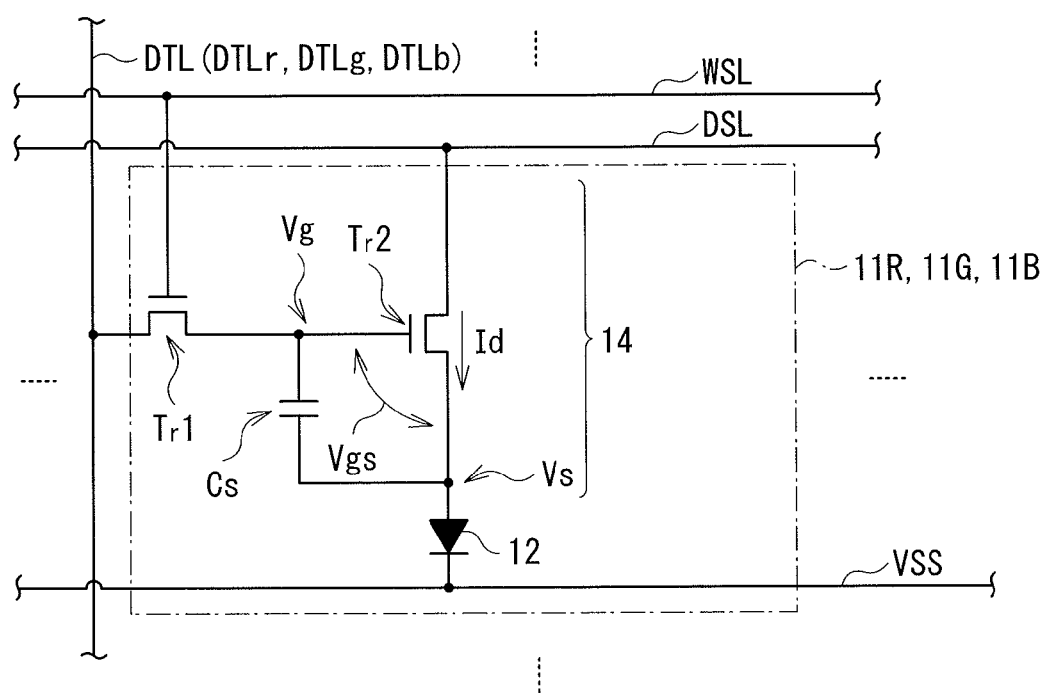
FIG. 3 is a circuit diagram illustrating an internal configuration example of each of subpixels illustrated in FIG. 2.

FIG. 3 illustrates an example of an internal configuration (a circuit configuration) of each of the subpixels 11R, 11G, and 11B. In each of the subpixels 11R, 11G, and 11B, the organic EL device 12 (a light-emission device) and a pixel circuit 14 are provided.

The pixel circuit 14 is configured using a write transistor Tr1 (for sampling), a drive transistor Tr2, and a retention capacitive element Cs. In other words, this pixel circuit 14 has a circuit configuration of a so-called "2Tr1C". Here, each of the write transistor Tr1 and the drive transistor Tr2 is formed of, for example, a TFT (Thin Film Transistor) of an n-channel MOS (Metal Oxide Semiconductor) type. It is to be noted that the type of the TFT is not limited in particular, and may be, for example, an inverted staggered structure (a so-called bottom gate type), or a staggered structure (a so-called top gate type).

Of the write transistor Tr1 in the pixel circuit 14, a gate is connected to the scanning line WSL, a drain is connected to the signal line DTL (DTLr, DTLg, and DTLb), and a source is connected to a gate of the drive transistor Tr2 and a first end of the retention capacitive element Cs. Of the drive transistor Tr2, a drain is connected to the power line DSL, and a source is connected to a second end of the retention capacitive element Cs and an anode of the organic EL device 12. A cathode of the organic EL device 12 is set to, for example, a fixed potential VSS (e.g., a ground potential) on a wire extending along a horizontal-line direction.

Figure 4C:
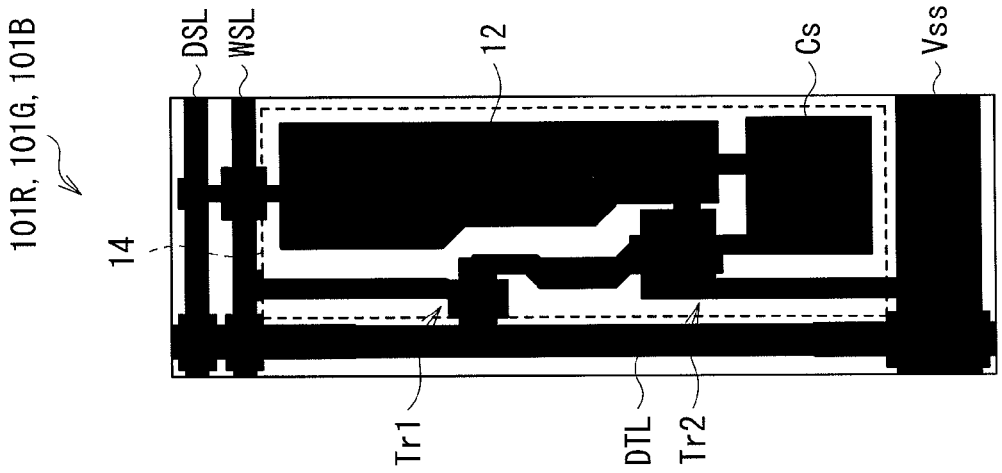
FIG. 4C is a diagram illustrating a comparative example 1.
Figure 4B:
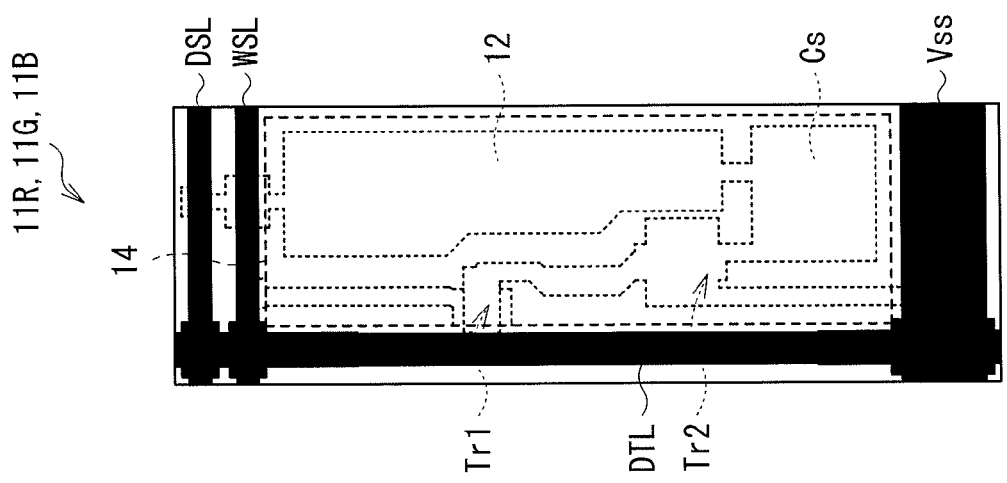
FIGS. 4A and 4B are diagrams each illustrating a plane configuration example of the subpixel illustrated in FIG. 3.
Figure 4A:
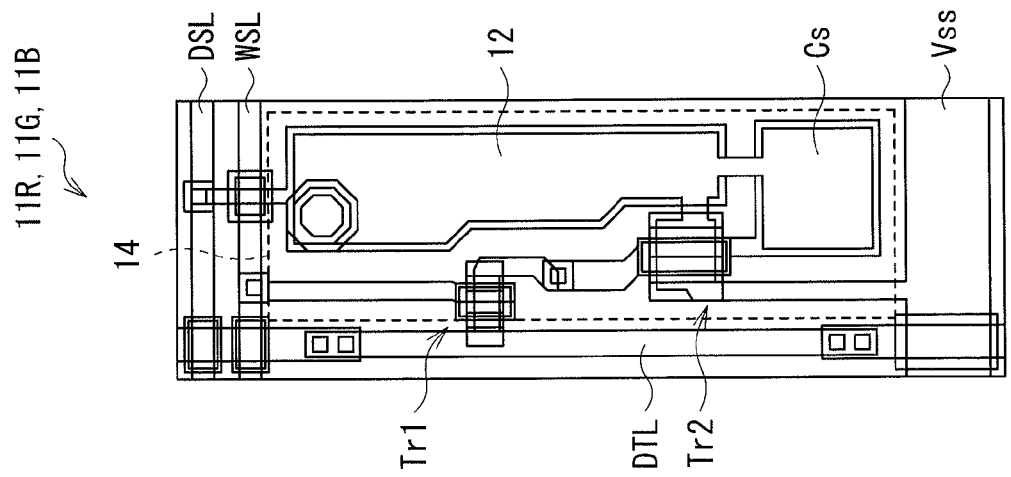

Here, in each of the subpixels 11R, 11G, and 11B of the present embodiment, at least a part thereof is the light-transmission region (a region indicated with a broken line in FIG. 4B), as illustrated in, for example, FIGS. 4A and 4B. Specifically, as will be described later in detail, in the pixel circuit 14 within each of the subpixels 11R, 11G, and 11B, at least a part of each of a semiconductor layer and an electrode layer as well as a wiring layer of a drive device (the write transistor Tr1, the drive transistor Tr2, and the retention capacitive element Cs) is configured using a light transmissive material (a transparent material). This allows the subpixels 11R, 11G, and 11B to exhibit a high aperture ratio of about 77%, for example. In contrast, each of subpixels 101R, 101G, and 101B according to a comparative example 1 illustrated in FIG. 4C (an example of related art, in which silicon (Si) which is a non-transparent material is used for a semiconductor layer, and non-transparence metal is used for an electrode layer and a wiring layer, of a drive device like the one described above) has a low aperture ratio of about 36%, for example. In other words, in the subpixels 11R, 11G, and 11B configured using the transparent material in at least the part thereof, the higher aperture ratio is realized, and visual recognition of the back-surface side is allowed, as compared with the subpixels 101R, 101G, and 101B configured using only the non-transparent materials.

Figure 5:
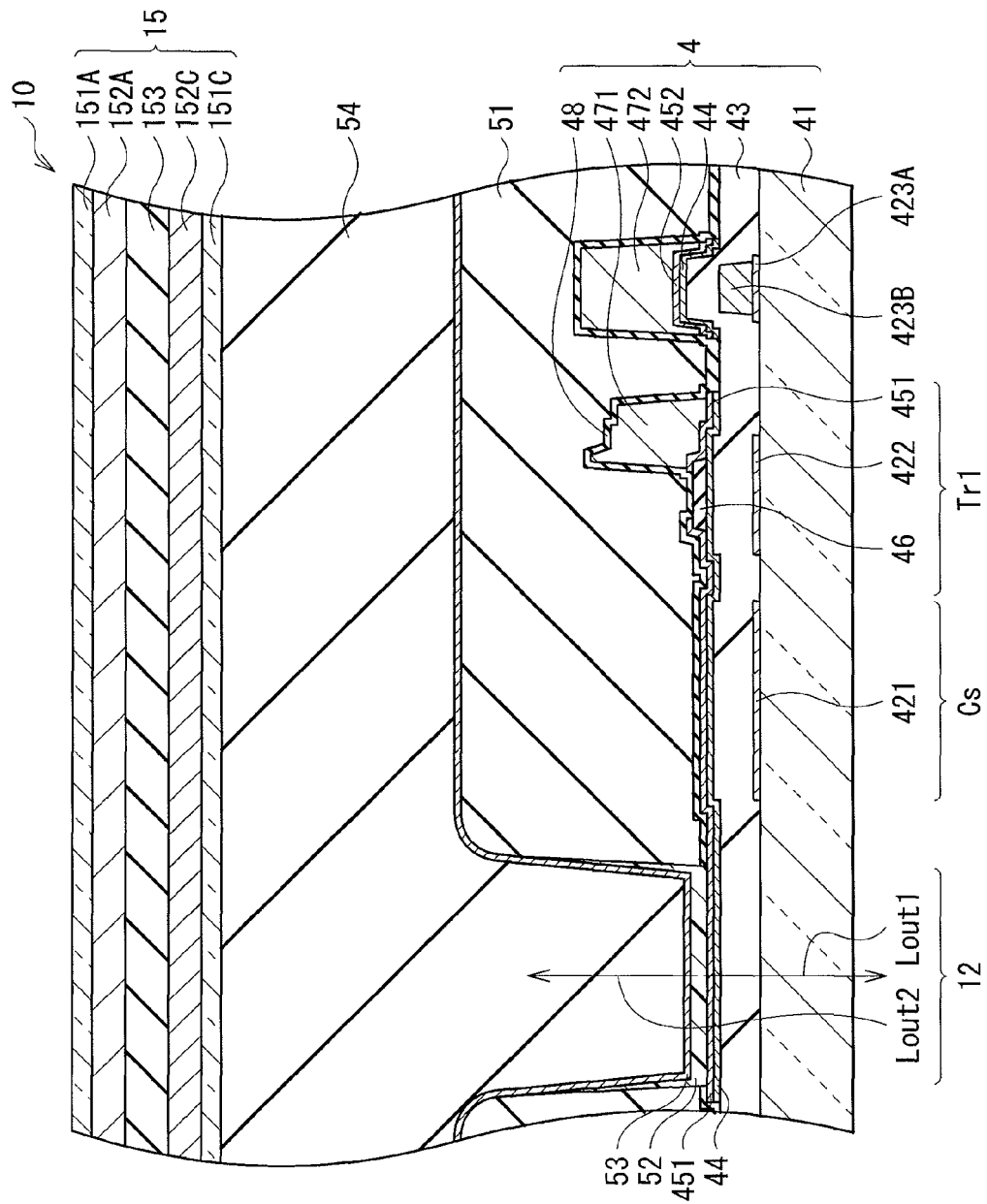
FIG. 5 is a schematic diagram illustrating a cross-sectional configuration example of a display panel illustrated in FIG. 1.

FIG. 5 schematically illustrates a cross-sectional configuration example of the display panel 10. The display panel 10 includes a TFT substrate 4, a inter-pixel insulating film 51, an organic layer 52, an electrode layer 53, a flattening film 54, and the transmittance control device 15, in this order from a front-face (surface) side to a rear-face (back-surface) side of the display 1.

The TFT substrate 4 includes a substrate 41, an electrode layer 421 and a gate electrode 422 as well as a wiring layer 423A, a metal layer 423B, a gate insulator 43, an oxide semiconductor layer 44, a protective layer 46, an electrode layer 451 as well as a wiring layer 452, an electrode layer 471 as well as a metal layer 472, and a protective layer 48, in this order from the front-face side to the rear-face side from of the display 1. The TFT substrate 4 is configured by forming elements including the drive device (the write transistor Tr1, the drive transistor Tr2, and the retention capacitive element Cs) described above.

The substrate 41 has optical transparency, and is made of, for example, a glass material or a resin material. It is to be noted that on this substrate 41, a buffer layer made of, for example, silicon oxide ($SiO_2$) or silicon nitride (SiN) may be provided beforehand to prevent entrance of contaminants from the substrate 41 to the drive device.

The electrode layer 421 is a first electrode of the retention capacitive element Cs. The gate electrode 422 is, here, a gate electrode of the write transistor Tr1. The wiring layer 423A forms wiring and the like in the pixel circuit 14. Each of the electrode layer 421, the gate electrode 422, and the wiring layer 423A is formed on the substrate 41, and made of, for example, a light transmissive material such as transparent oxide semiconductors including ITO, IZO (Indium Zinc Oxide), and AZO (Aluminum Zinc Oxide), and transparent carbon. The electrode layer 421, the gate electrode 422, and the wiring layer 423A each made of such a material is formed by sputtering, for example.

The metal layer 423B is formed to be electrically connected on the wiring layer 423A, and is provided to lower resistance (wiring resistance) of the entire wiring including the signal lines DTL, for example. For the metal layer 423B, there may be used a layered structure including a metal layer (molybdenum (Mo), titanium (Ti), manganese (Mn) etc.) on the wiring layer 423A side and a metal layer (aluminum (Al), copper (Cu) etc.) thereon, for example.

The gate insulator 43 is provided to cover the electrode layer 421, the gate electrode 422, the wiring layer 423A, and the metal layer 423B, and made of, for example, $SiO_2$ formed by PECVD (Plasma Enhanced Chemical Vapor Deposition). However, as a substitute therefor, for instance, any of $Si_3N_4$, aluminum oxide ($Al_2O_3$), and a laminated film made thereof may be used.

The oxide semiconductor layer 44 is made of, for example, a complex oxide of elements such as In, Ga (gallium), Zn, and Sn, and formed using DC sputtering, RF sputtering, or the like, for example. In particular, it is desirable to use the DC sputtering, in view of sedimentation rate.

The protective layer 46 is provided on a channel region including the write transistor Tr1 and the like in the oxide semiconductor layer 44, and functions as a channel protective film. This protective layer 46 is made of SiO or the like formed by PECVD, for example.

The electrode layer 451 form electrodes including a second electrode in the retention capacitive element Cs, a source/drain electrode in the write transistor Tr1, and an anode electrode (a pixel electrode) in the organic EL device 12. The wiring layer 452 forms wiring and the like in the pixel circuit 14. The electrode layer 451 and the wiring layer 452 are also made of, for example, a light transmissive material such as the transparent oxide semiconductors and the transparent carbon described above.

The electrode layer 471 is provided on a source/drain region in the write transistor Tr1 of the electrode layer 451, and the metal layer 472 is provided on the wiring layer 452. Each of the electrode layer 471 and the metal layer 472 is provided to lower electrical resistance of the source/drain electrode and the wiring, and made of, for example, Al or Cu.

The protective layer 48 is provided to cover the retention capacitive element Cs, the write transistor Tr1, the wiring, and the like, and functions as a so-called passivation film. The protective layer 48 is made of, for example, a material with a high gas barrier property, such as $Al_2O_3$ formed by sputtering or ALD (Atomic Layer Deposition), $SiO_2$ and $Si_3N_4$ formed by sputtering or PECVD, and a laminated film made thereof.

The inter-pixel insulating film 51 is provided to isolate the organic EL devices 12 of the subpixels 11R, 11G, and 11B from each other, and made of an organic insulating material such as polyimide and acrylic. The inter-pixel insulating film 51 may be formed using a spin coating method, a slit coating method, a die coating method, or the like.

The organic layer 52 has a configuration in which, for example, a luminous layer, a hole injection layer, a hole transport layer, an electron injection layer, and an electron transport layer (none of them illustrated) are laminated.

The electrode layer 53 forms a cathode electrode (a common electrode) in the organic EL device 12, and is provided to cover the organic layer 52 and the inter-pixel insulating film 51 from above. This electrode layer 53 is also made of, for example, a light transmissive material such as the transparent oxide semiconductors and the transparent carbon described above, or a light transmissive material made of a thin metallic layer. It is to be noted that this electrode layer 53, the organic layer 52, and the electrode layer 451 form the organic EL device 12.

The flattening film 54 is provided to cover the electrode layer 53 from above, and made of, for example, a material (an organic insulating material such as polyimide and acrylic) similar to that of the inter-pixel insulating film 51.

The transmittance control device 15 includes a transparent electrode 151C, an EC material layer 152C, a dielectric film 153, an EC material layer 152A, and a transparent electrode 151A, in this order from the front-face side to the rear-face side of the display 1. The transmittance control device 15 configured of an electrochromic (EC) device is formed by having such a layered structure.

Each of the transparent electrodes 151C and 151A functions as an electrode (a cathode electrode and an anode electrode) of driving the electrochromic device, and is made of, for example, a light transmissive material such as the transparent oxide semiconductors and the transparent carbon described above. It is to be noted that the transparent electrodes 151C and 151A are each formed like a comb orthogonal to each other, for example.

The EC material layer 152C is made of a cathodic electrochromic material (an EC material) such as a tungsten oxide ($WO_3$), a vanadium oxide ($V_2O_5$), and a molybdenum oxide ($MoO_3$), and may be formed using an electron-beam evaporation technique, sputtering, or the like.

The EC material layer 152A is made of an anodic EC material such as a nickel oxide (NiO), an iridium oxide (IrO), and a cobalt oxide (CoO), and may be formed using an electron-beam evaporation technique, sputtering, or the like.

The dielectric film 153 is made of a material such as dielectric bodies including a tantalum oxide ($Ta_2O_5$) which is a metal oxide, and porous polymers, for example.

(Drive Circuit 20)

The drive circuit 20 illustrated in FIG. 1 drives the pixel array section 13 (the display panel 10) (i.e. performs display driving). Specifically, the drive circuit 20 performs display driving for the plurality of pixels 11, by sequentially selecting the plurality of pixels 11 in the pixel array section 13, and writing an image signal voltage in each of the subpixels 11R, 11G, and 11B within the selected pixel 11, based on the image signal 20A. In other words, the drive circuit 20 performs the display driving for each of the subpixels 11R, 11G, and 11B, based on the image signal 20A. The drive circuit 20 also has a function of driving the transmittance control device 15. The drive circuit 20 includes an image-signal processing circuit 21, a timing generation circuit 22, a scanning-line drive circuit 23, a signal-line drive circuit 24, a power-line drive circuit 25, and a control-device drive circuit 26.

The image-signal processing circuit 21 performs predetermined image-signal processing on the image signal 20A in digital form inputted from outside, and outputs an image signal 21A after such image-signal processing to the signal-line drive circuit 24. Examples of this predetermined image-signal processing include gamma correction processing, and overdrive processing.

The timing generation circuit 22 generates and outputs a control signal 22A based on the synchronization signal 20B inputted from outside, thereby controlling the scanning-line drive circuit 23, the signal-line drive circuit 24, the power-line drive circuit 25, and the control-device drive circuit 26 to operate together.

The scanning-line drive circuit 23 sequentially selects the plurality of pixels 11, by sequentially applying a selection pulse to the plurality of scanning lines WSL according to (in synchronization with) the control signal 22A. Specifically, the scanning-line drive circuit 23 generates the selection pulse by selectively outputting a voltage Von to be applied to set the write transistor Tr1 in an ON state, or a voltage Voff to be applied to set the write transistor Tr1 in an OFF state. Here, the voltage Von is a value (a constant value) equal to or higher than an ON voltage of the write transistor Tr1, and the voltage Voff is a value (a constant value) lower than the ON voltage of the write transistor Tr1.

The signal-line drive circuit 24 generates an analog image signal corresponding to the image signal 21A inputted from the image-signal processing circuit 21, according to (in synchronization with) the control signal 22A, and applies the generated signal to each of the signal lines DTL (DTLr, DTLg, and DTLb). Specifically, the signal-line drive circuit 24 applies the analog image signal voltage for each color based on this image signal 21A to each of the signal lines DTLr, DTLg, and DTLb individually. In this way, image-signal writing is performed for each of the subpixels 11R, 11G, and 11B within the pixel 11 selected by the scanning-line drive circuit 23. It is to be noted that the image-signal writing indicates programming of the image signal voltage for the retention capacitive element Cs, and application of a predetermined voltage between the gate and the source of the drive transistor Tr2.

The power-line drive circuit 25 sequentially applies a control pulse to the plurality of power lines DSL according to (in synchronization with) the control signal 22A, thereby controlling light-emission (lighting) operation and non-light-emission (extinction) operation of the organic EL device 12 in each of the subpixels 11R, 11G, and 11B in each of the pixels 11. To be more specific, the power-line drive circuit 25 adjusts the width (pulse width) of the control pulse, and thereby controls the length of each of a light-emission period and a non-light-emission period (an extinction period) in each of the subpixels 11R, 11G, and 11B in each of the pixels 11 (i.e. performs PWM (Pulse Width Modulation) control).

The control-device drive circuit 26 performs driving operation of applying a drive voltage (a drive voltage Vd1 or the like) which will be described later, between the transparent electrodes 151A and 151C in the transmittance control device 15, thereby controlling the operation of the transmittance control device 15 (i.e. performs switching control between the incident-light transmission operation and the incident-light absorption operation).

[Functions and Effects of Display 1]

(1. Basic Operation)

In this display 1, the drive circuit 20 performs the display driving based on the image signal 20A and the synchronization signal 20B, on each of the pixels 11 (each of the subpixels 11R, 11G, and 11B) in the display panel 10 (the pixel array section 13), as illustrated in FIG. 1 to FIG. 3. As a result, a drive current is fed into the organic EL device 12 in each of the subpixels 11R, 11G, and 11B, and hole-electron recombination takes place in the luminous layer in the organic layer 52, thereby causing light emission, as illustrated in FIG. 5. Then, in each of the subpixels 11R, 11G, and 11B, emission light Lout 1 from this organic layer 52 (the luminous layer) is outputted as display light towards the front-face side (the substrate 41 side), and emission light Lout2 is outputted towards the rear-face side (the transmittance control device 15 side). In this way, image display based on the image signal 20A is performed on the display panel 10.

Here, operation of writing the image signal in each of the subpixels 11R, 11G, and 11B is performed, as illustrated in FIG. 3. First, the scanning-line drive circuit 23 raises the voltage of the scanning line WSL from the voltage Voff to the voltage Von, during a period in which the voltage of the signal line DTL is the image signal voltage and the voltage of the power line DSL is a voltage VH (in a "H (high)" state). This causes the write transistor Tr1 to enter the ON state, and thus, a gate potential Vg of the drive transistor Tr2 increases to the image signal voltage corresponding to the voltage at this moment of the signal line DTL. As a result, the image signal voltage is written into the retention capacitive element Cs and retained.

Here, at this stage, an anode voltage of the organic EL device 12 is still smaller than a voltage value (Vel+Vca) which is the sum of a threshold voltage Vel and a cathode voltage Vca (=VSS) in the organic EL device 12, and the organic EL device 12 is in a cut-off state. In other words, at this stage, the current is yet to flow between the anode and the cathode of the organic EL device 12 (i.e. the organic EL device 12 does not emit light). Therefore, a current Id supplied from the drive transistor Tr2 flows to a device capacitance (not illustrated) present in parallel between the anode and the cathode of the organic EL device 12, and this device capacitance is charged.

Next, the scanning-line drive circuit 23 lowers the voltage of the scanning line WSL from the voltage Von to the voltage Voff, during a period in which the voltage of the signal line DTL and the voltage of the power line DSL are maintained at the image signal voltage and the voltage VH (in the "H" state), respectively. This causes the write transistor Tr1 to enter the OFF state, and thus, the gate of the drive transistor Tr2 enters a floating state. Then, in the state in which a voltage Vgs between the gate and the source of the drive transistor Tr2 is kept constant, the current Id flows between the drain and the source of the drive transistor Tr2. As a result, a source potential Vs of the drive transistor Tr2 rises, and the gate potential Vg of the drive transistor Tr2 also rises by capacitive coupling through the retention capacitive element Cs. This causes the anode voltage of the organic EL device 12 to become greater than the voltage value (Vel+Vca) which is the sum of the threshold voltage Vel and the cathode voltage Vca in the organic EL device 12. Consequently, the current Id, which corresponds to the image signal voltage retained by the retention capacitive element Cs, namely, the voltage Vgs between the gate and the source in the drive transistor Tr2, flows between the anode and the cathode of the organic EL device 12, and thereby the organic EL device 12 emits light at desired intensity.

Next, the drive circuit 20 terminates the light-emission period of the organic EL device 12, after a lapse of a predetermined period. Specifically, the power-line drive circuit 25 lowers the voltage of the power line DSL from the voltage VH to a voltage VL (i.e. shifts the voltage from the "H" state to the "L (low)" state). Then, the source potential Vs of the drive transistor Tr2 drops. This causes the anode voltage of the organic EL device 12 to become smaller than the voltage value (Vel+Vca) which is the sum of the threshold voltage Vel and the cathode voltage Vca in the organic EL device 12, and the current Id stops flowing between the anode and the cathode. As a result, the organic EL device 12 extinguishes afterwards (shifts to the extinction period). In this way, the length of the light emission period in each of the subpixels 11R, 11G, and 11B in each of the pixels 11 is controlled, according to the width of the control pulse applied to the power line DSL (here, the length of the period of the "H" state).

It is to be noted that afterwards, the drive circuit 20 performs the display driving to repeat the light emission operation and the extinction operation periodically, for every frame period (one vertical period, or one V period). At the same time, the drive circuit 20 performs scanning in a row direction, with each of the control pulse applied to the power line DSL and the selection pulse applied to the scanning line WSL, for every horizontal period (a 1H period), for example. The display operation (the display driving by the drive circuit 20) is thus performed in the display 1.

(2. Function of Transmittance Control Device 15)

Next, function of the transmittance control device 15 which is one of characteristic parts in the display 1 of the present embodiment will be described in detail, while making a comparison with a comparative example (a comparative example 2).

Comparative Example 2

Figure 6:
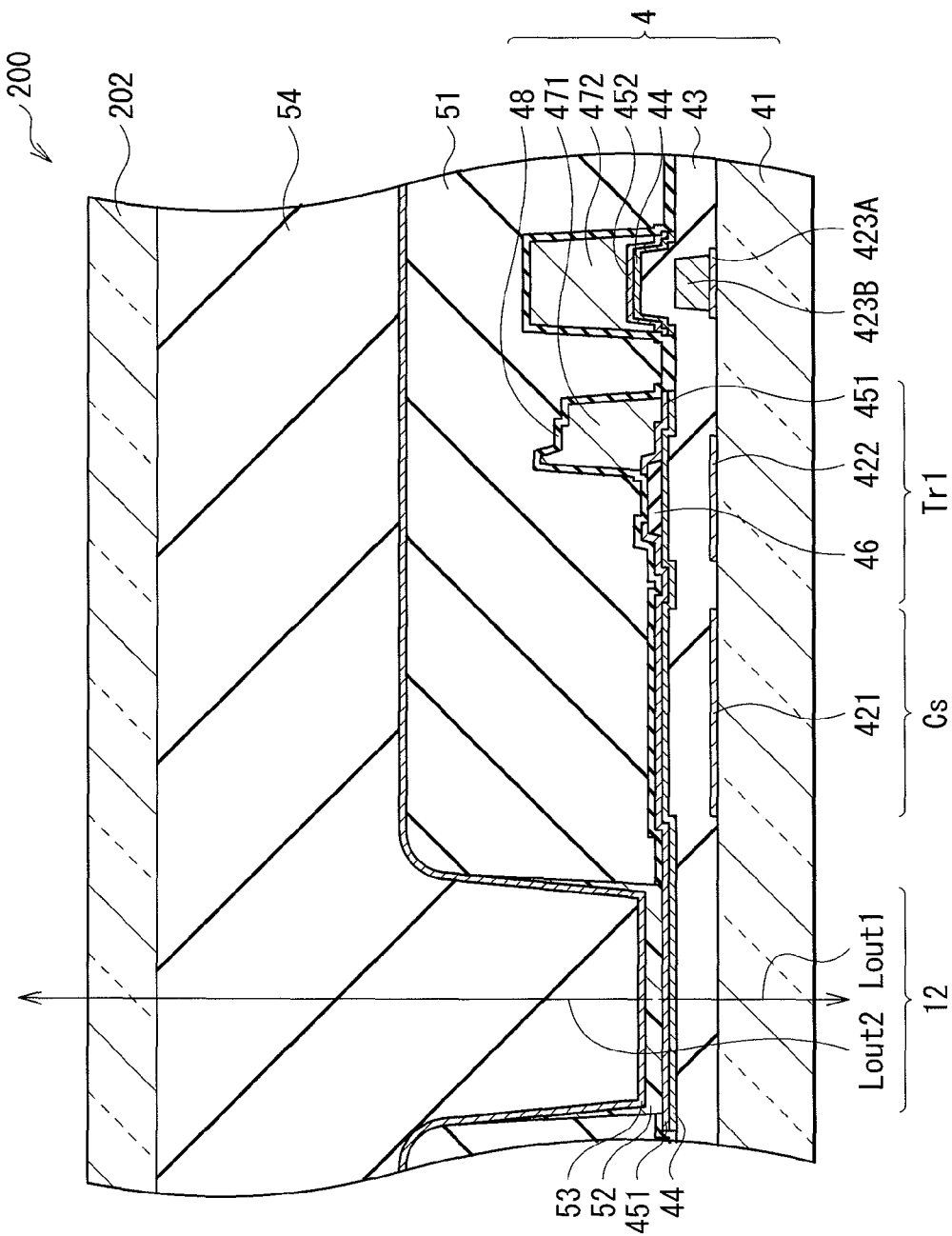
FIG. 6 is a schematic diagram illustrating a cross-sectional configuration example of a display panel according to a comparative example 2.

First, unlike the present embodiment, the transmittance control device 15 is not provided in a display panel (a display panel 200) according to the comparative example 2 illustrated in FIG. 6. Specifically, in place of the transmittance control device 15, a sealing substrate 202 (a cover glass) is provided on a flattening film 54 in the display panel 200.

Figure 7A:
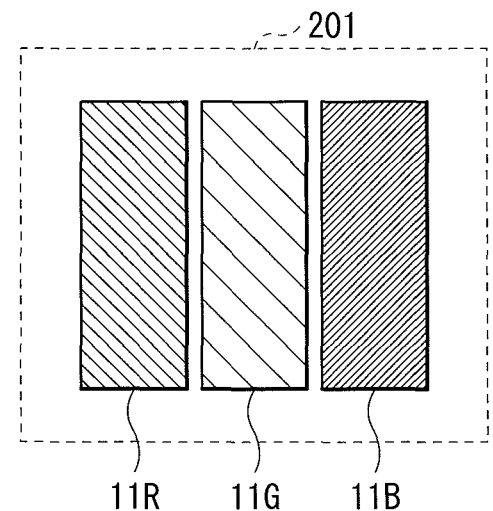
FIGS. 7A and 7B are plan views schematically illustrating a visual recognition state at the time of light emission and a visual recognition state at the time of non-light emission, respectively, in a pixel according to the comparative example 2.
Figure 7B:
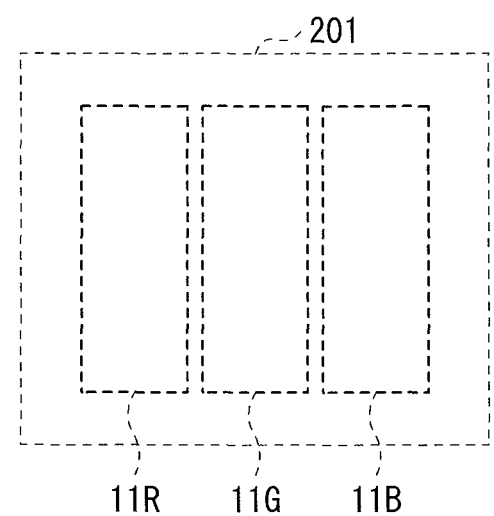

Therefore, in this comparative example 2, at the time of light emission (FIG. 7A) and at the time of non-light emission (FIG. 7B) in each of subpixels 11R, 11G, and 11B (an organic EL device 12) in a pixel 201, visual-recognition states become those illustrated in FIGS. 7A and 7B, respectively, for example. In other words, first, at the time of the light emission illustrated in FIG. 7A, emission light (emission light Lout1 and Lout2) is outputted from each of the subpixels 11R, 11G, and 11B to both of a surface side (a user side) and a back-surface side. On the other hand, at the time of the non-light emission illustrated in FIG. 7B, no emission light is outputted from each of the subpixels 11R, 11G, and 11B and thus, for example, each of the subpixels 11R, 11G, and 11B is in an external-light-transmitted state.

Here, this comparative example 2 is disadvantageous in that visibility decreases because each of the subpixels 11R, 11G, and 11B is usually in the light-transmitted state. Specifically, in an application for normal display, for example, improvement of visibility is prevented even at the time of the non-light emission illustrated in FIG. 7B, because a black display state is not available due to existence of the external light (transmitted light coming from the back-surface side). Moreover, in an application for AR, for instance, the visibility also greatly decreases at the time of the light emission illustrated in FIG. 7A, in an outdoor use with a large quantity of light (external light).

Function of Present Embodiment

In contrast, as illustrated in FIG. 1 and FIG. 5, the transmittance control device 15 capable of controlling the transmittance of the incident light is provided in the display panel 10 of the present embodiment. This realizes controlling of the light-transmittance to be appropriate to a light emission state (at the time of the light emission or the non-light emission) in the organic EL device 12 in the pixel 11 having the light-transmission region, as will be described below in detail.

Figure 8A:
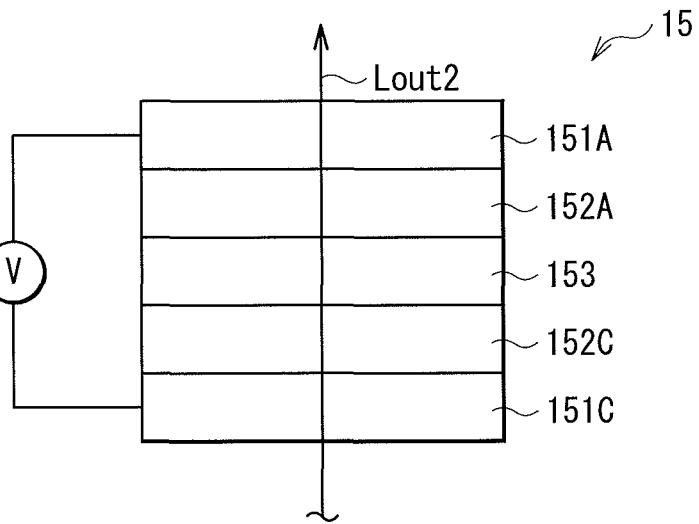
FIGS. 8A and 8B are schematic diagrams for description of a light transmission state and a light absorption state in a transmittance control device illustrated in FIG. 5.

First, in this transmittance control device 15, each of the EC material layers 152A and 152C exhibits optical transparency when the drive voltage Vd1 is not applied between the transparent electrodes 151A and 151C, as illustrated in FIG. 8A. For this reason, the transmittance control device 15 as a whole exhibits the optical transparency, and light including the emission light Lout2 outputted from the organic EL device 12 to the rear-face side and external light is allowed to pass therethrough (in a transparent (light transmission) state).

Figure 8B:
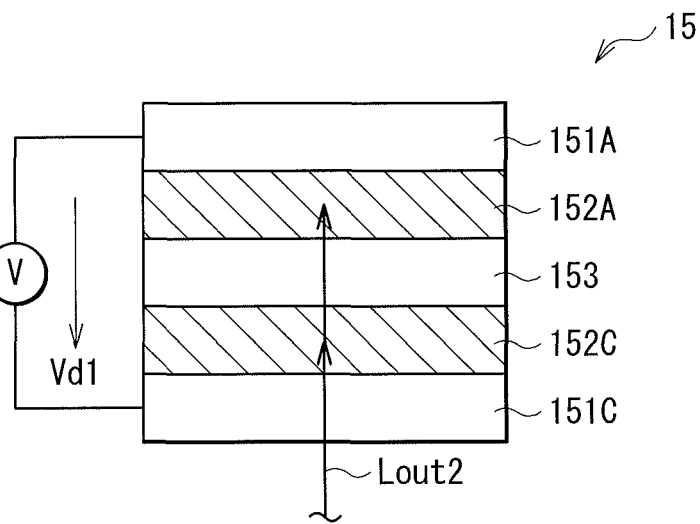

On the other hand, when the drive voltage Vd1 is applied between the transparent electrodes 151A and 151C, each of the EC material layers 152A and 152C is colored and does not exhibit optical transparency, as illustrated in FIG. 8B. For this reason, the transmittance control device 15 as a whole does not exhibit the optical transparency, and the light including the emission light Lout2 and the external light is not allowed to pass therethrough (in a colored (light absorption) state).

In this way, the transmittance control device 15 is allowed to switch the operation between the incident-light (the light including the emission light Lout2 and the external light) transmission operation and the incident-light absorption operation, depending on the presence or absence of the application of the drive voltage Vd1. Thus, in the present embodiment, the switching control between the transmission operation and the absorption operation as described above is performed at the time of each of the light emission and the non-light emission of the organic EL device 12.

In the present embodiment therefore, at the time of each of the light emission and the non-light emission in each of the subpixels 11R, 11G, and 11B (the organic EL device 12) in the pixel 11, the respective visual recognition states become those illustrated in FIGS. 9A to 9D, for example, depending on the combination of the light transmission state and the light absorption state in the transmittance control device 15.

Figure 9A:
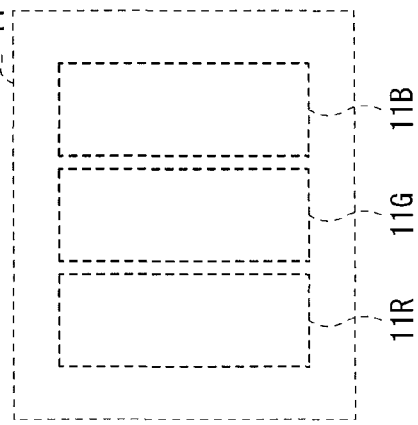
FIGS. 9A to 9D are plan views schematically illustrating visual recognition states at the time of light emission and at the time of non-light emission, in the pixel of the first embodiment.

Specifically, first, as illustrated in FIG. 9A, the visual recognition state is similar to that in FIG. 7A in the comparative example 2, when the transmittance control device 15 is in the light transmission state at the time of the light emission of the organic EL device 12. In other words, the emission light (the emission light Lout1 and Lout2) from each of the subpixels 11R, 11G, and 11B is outputted to both of the surface side and the back-surface side of the display 1.

Figure 9B:
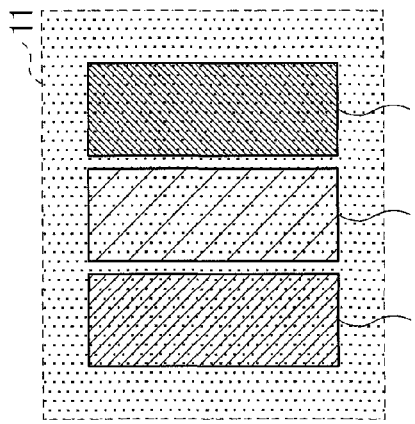

Further, as illustrated in FIG. 9B, when the transmittance control device 15 is in the light transmission state at the time of the non-light emission of the organic EL device 12, the visual recognition state is similar to that in FIG. 7B in the comparative example 2. In other words, for example, an external-light-transmitted state is realized, because no emission light is outputted from each of the subpixels 11R, 11G, and 11B.

Figure 9C:
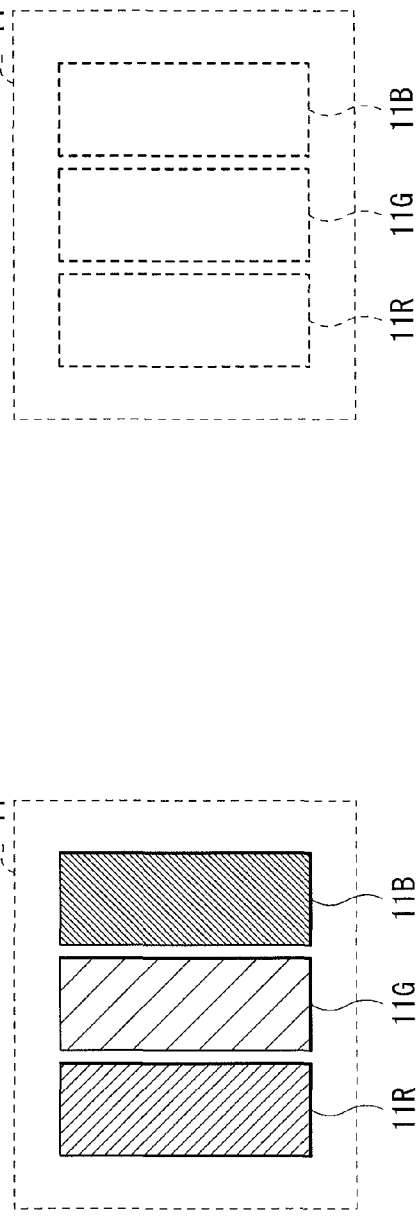

On the other hand, as illustrated in FIG. 9C, when the transmittance control device 15 is in the light absorption state at the time of the non-light emission of the organic EL device 12, the visual recognition state becomes as follows. That is, although the emission light is not outputted from each of the subpixels 11R, 11G, and 11B as in the state of FIG. 9B, the light including the external light is not allowed to pass therethrough because the transmittance control device 15 is in the light absorption state. Therefore, a black display state is realized as illustrated in FIG. 9C, and the visibility improves in an application for normal display, for example, as compared with the state in each of FIG. 7B and FIG. 9B.

Figure 9D:
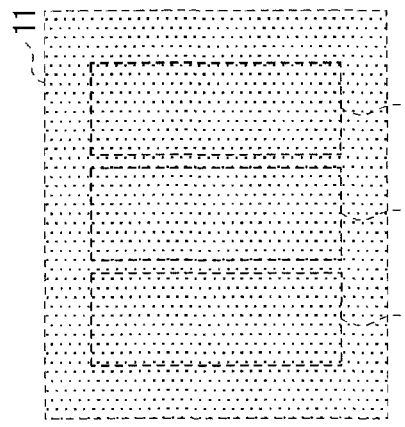

Furthermore, as illustrated in FIG. 9D, when the transmittance control device 15 is in the light absorption state at the time of the light emission of the organic EL device 12, the visual recognition state becomes as follows. That is, although the emission light from each of the subpixels 11R, 11G, and 11B is outputted to both of the surface side and the back-surface side as in the state of FIG. 9A, the light including the emission light Lout2 and the external light is not allowed to pass therethrough (the rear-face side becomes black), because the transmittance control device 15 is in the light absorption state. Therefore, as illustrated in FIG. 9D, the visibility improves even in a case where the external light is intense in an application for AR, for example, as compared with the state in each of FIG. 7A and FIG. 9A.

In the present embodiment, the transmittance control device 15 capable of controlling the transmittance of the incident light is provided as described above. Thus, the light transmittance is controlled to be appropriate to the light emission state in the organic EL device 12 in the pixel 11 having the light-transmission region. Therefore, the visibility in the display 1 with the pixels 11 each having the light-transmission region is enhanced (for example, the visibility in displaying information is enhanced, while securing the visibility on the back-surface side). Hence, when this display 1 is used as a display for AR, for example, the presence is improved.

In addition, since the transmittance control device 15 is provided as only one device common to all the pixels 11 in the pixel array section 13, configurations of the display panel 10 and the control-device drive circuit 26 (wiring and the like used in the driving) are simplified.

Next, other embodiments (a second embodiment and a third embodiment) of the disclosure will be described. It is to be noted that the same elements as those of the first embodiment will be provided with the same characters as those of the first embodiment, and the description will be omitted as appropriate.

Second Embodiment

[Configuration of Display Panel 10A]

Figure 10:
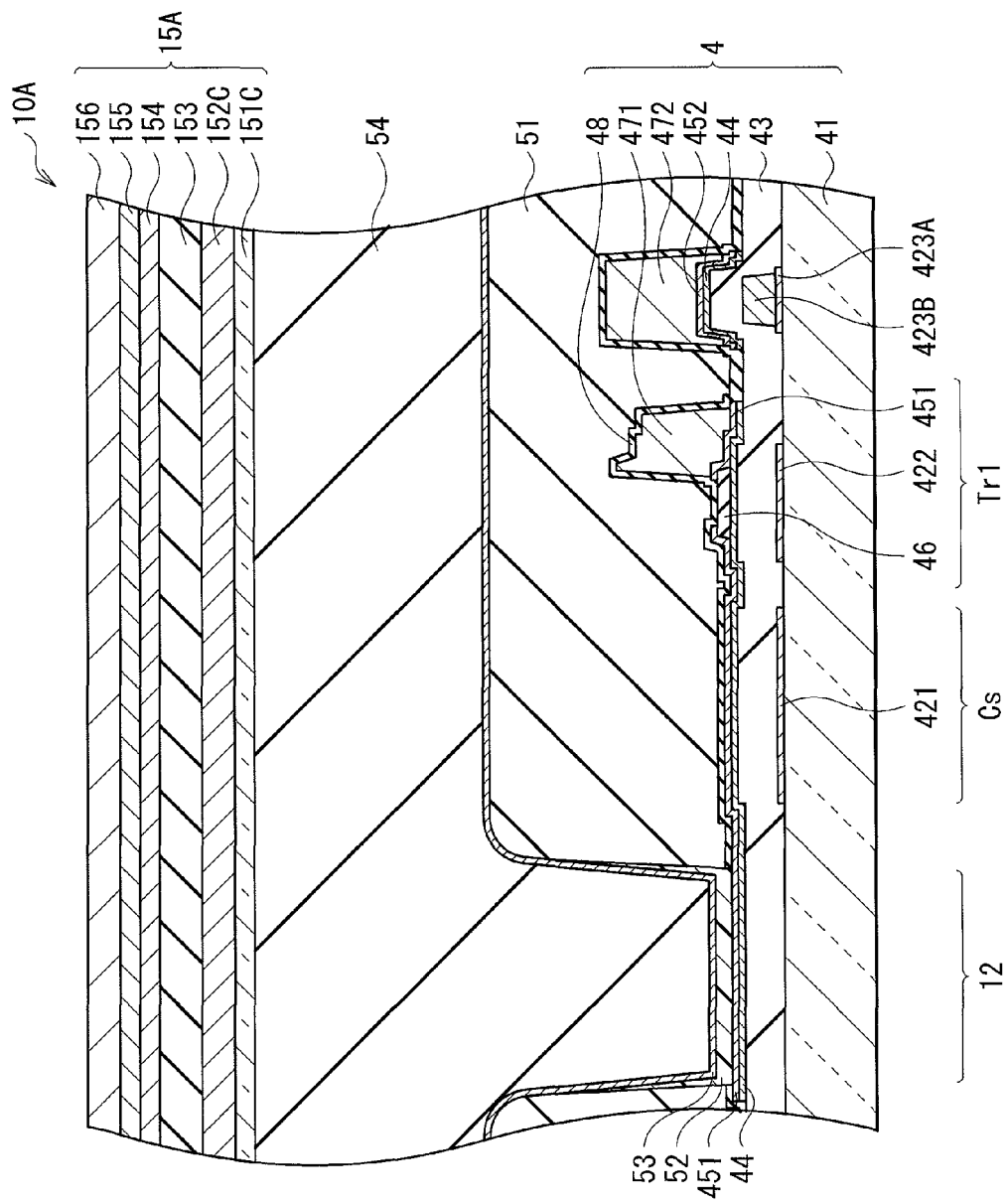
FIG. 10 is a schematic diagram illustrating a cross-sectional configuration example of a display panel according to a second embodiment.

FIG. 10 schematically illustrates a cross-sectional configuration example of a display panel (a display panel 10A) according to a second embodiment. The display panel 10A of the present embodiment is configured by providing a transmittance control device 15A in place of the transmittance control device 15 in the display panel 10 of the first embodiment, and is otherwise similar in configuration to the first embodiment.

The transmittance control device 15A includes a transparent electrode 151C, an EC material layer 152C, a dielectric film 153, a buffer layer 154, a catalytic layer 155, and a dimming mirror layer 156, in this order from a front-face side to a rear-face side of a display 1. In other words, this transmittance control device 15A has a configuration in which the buffer layer 154, the catalytic layer 155, and the dimming mirror layer 156 are provided in place of the EC material layer 152A and the transparent electrode 151A in the transmittance control device 15.

By having such a configuration, the transmittance control device 15A of the present embodiment serves as an electrochromic device capable of switching operation between incidence-light transmission operation and incident-light reflection operation, unlike the transmittance control device 15, as will be described later. In other words, this transmittance control device 15A is capable of switching the operation between the transmission operation and the reflection operation, at the time of each of light emission and non-light emission of an organic EL device 12.

Here, the buffer layer 154 is made of Al, for example. The catalytic layer 155 is made of palladium (Pd), for example. The dimming mirror layer 156 is made of magnesium-nickel (Mg—Ni) alloy, for instance, and functions as a counter electrode (a cathode electrode) for the transparent electrode 151C. Therefore, the dimming mirror layer 156 and the transparent electrode 151C are each formed like a comb orthogonal to each other, for example.

[Functions and Effects of Display Panel 10A]

In this transmittance control device 15A, when a drive voltage Vd2 is applied between the transparent electrode 151C and the dimming mirror layer 156 by a control-device drive circuit 26, the dimming mirror layer 156 exhibits optical transparency, as illustrated in FIG. 11A. For this reason, the transmittance control device 15A as a whole exhibits optical transparency, and light including emission light Lout2 outputted from the organic EL device 12 towards the rear-face side and external light is allowed to pass therethrough (a transparent (light transmission) state).

On the other hand, when the drive voltage Vd2 is not applied between the transparent electrode 151C and the dimming mirror layer 156, the dimming mirror layer 156 exhibits light reflectivity (does not exhibit the optical transparency) as illustrated in FIG. 11B. For this reason, the transmittance control device 15A as a whole exhibits light reflectivity (does not exhibit the optical transparency), and the light including the emission light Lout2 and the external light is reflected to the front-face side of the display 1 and thus prevented from passing therethrough towards the back-surface side (a mirror (light reflection) state).

In this way, the transmittance control device 15A is allowed to switch the operation between the incident-light (the light including the emission light Lout2 and the external light) transmission operation and the incident-light reflection operation, depending on the presence or absence of the application of the drive voltage Vd2. In the present embodiment therefore, the switching control between the transmission operation and the reflection operation is performed at the time of each of the light emission and the non-light emission of the organic EL device 12.

In the present embodiment, at the time of the light emission and at the time of the non-light emission in each of subpixels 11R, 11G, and 11B (the organic EL device 12) in a pixel 11A, the respective visual recognition states become, for example, those illustrated in FIGS. 12A to 12D, depending on the combination of a light transmission state and a light reflection state in the transmittance control device 15A described above.

Specifically, first, as illustrated in FIG. 12A, when the transmittance control device 15A is in the light transmission state at the time of the light emission of the organic EL device 12, the visual recognition state is similar to the state in FIG. 9A in the first embodiment. In other words, the emission light (emission light Lout1 and Lout2) from each of the subpixels 11R, 11G, and 11B is outputted to both of the surface side and the back-surface side of the display 1.

Further, as illustrated in FIG. 12B, when the transmittance control device 15A is in the light transmission state at the time of the non-light emission of the organic EL device 12, the visual recognition state is similar to the state in FIG. 9B. In other words, for example, an external-light-transmitted state is realized, because no emission light is outputted from each of the subpixels 11R, 11G, and 11B.

On the other hand, as illustrated in FIG. 12C, when the transmittance control device 15A is in the light reflection state at the time of the non-light emission of the organic EL device 12, the visual recognition state becomes as follows. That is, although the emission light is not outputted from each of the subpixels 11R, 11G, and 11B as in the state of FIG. 12B, the light including the external light is not allowed to pass therethrough because the transmittance control device 15A is in the light reflection state. Meanwhile, the incident light (external light) from the front-face side is reflected to the front-face side, because the transmittance control device 15A is in the light reflection state.

Furthermore, as illustrated in FIG. 12D, when the transmittance control device 15A is in the light reflection state at the time of the light emission of the organic EL device 12, the visual recognition state becomes as follows. That is, although the emission light from each of the subpixels 11R, 11G, and 11B is outputted to both of the surface side and the back-surface side as in the state of FIG. 12A, the emission light Lout2 towards the back-surface side is reflected to the front-face side resulting in an increase in emission intensity, because the transmittance control device 15A is in the light reflection state. Meanwhile, although the external light from the front-face side is reflected, visibility improves because the emission intensity is increased. Therefore, as illustrated in FIG. 12D, the visibility improves even in a case where the external light is intense in an application for AR, for example, as compared with the case in each of FIG. 7A and FIG. 12A.

In the present embodiment, since the transmittance control device 15A is provided, the visibility in the display 1 with the pixels 11 each having a light-transmission region is enhanced (for example, the light reflection state is established in a dark environment and thereby, the light including the emission light Lout heading for the back-surface side is extracted on the front-face side, which improves the visibility), as in the first embodiment. Therefore, when this display 1 is used as a display for AR, for example, the presence is improved.

Third Embodiment

[Configuration of Display Panel 10B]

Figure 13:
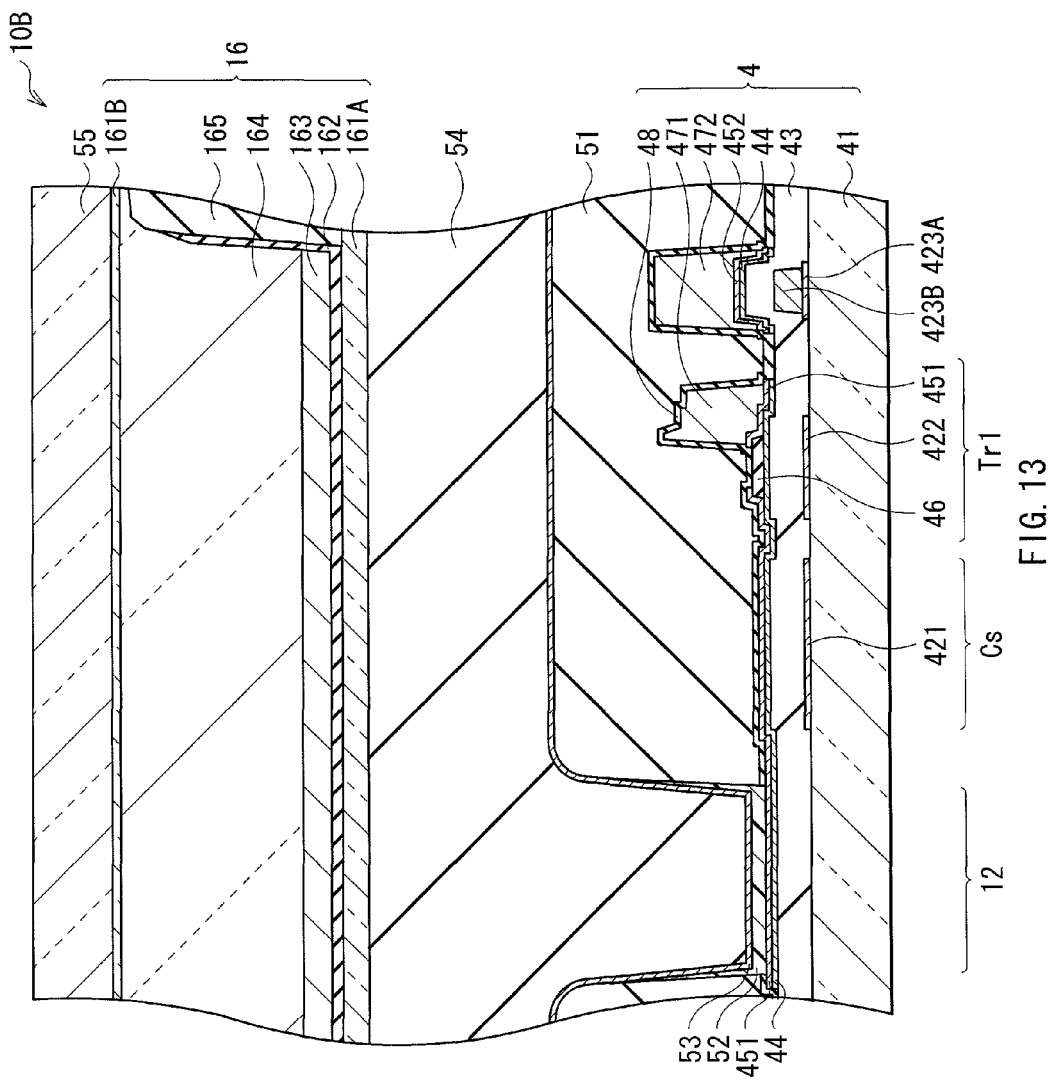
FIG. 13 is a schematic diagram illustrating a cross-sectional configuration example of a display panel according to a third embodiment.

FIG. 13 schematically illustrates a cross-sectional configuration example of a display panel (a display panel 10B) according to a third embodiment. The display panel 10B of the present embodiment is configured by providing a sealing substrate 55 and a transmittance control device 16 in place of the transmittance control device 15 in the display panel 10 of the first embodiment, and is otherwise similar in configuration to the first embodiment.

The transmittance control device 16 includes a transparent electrode 161A, a hydrophobic insulating film 162 as well as a partition 165, a nonpolar liquid 163, a polar liquid 164, and a transparent electrode 161B, in this order from a front-face side to a rear-face side of a display 1.

By having such a configuration, the transmittance control device 16 of the present embodiment serves as an electrowetting device capable of switching operation between incident-light transmission operation and incident-light absorption operation as will be described later, unlike the transmittance control devices 15 and 15A. In other words, this transmittance control device 16 is capable of switching the operation between the transmission operation and the absorption operation, at the time of each of light emission and non-light emission of an organic EL device 12.

The transparent electrodes 161A and 161B each function as a driving electrode of the electrowetting device, and is made of, for example, a light transmissive material such as the transparent oxide semiconductors and the transparence carbon described above. It is to be noted that the transparent electrodes 161A and 161B are each formed like a comb orthogonal to each other, for example.

The partition 165 is a wall section provided to separate the hydrophobic insulating film 162, the nonpolar liquid 163, and the polar liquid 164 in each of subpixels 11R, 11G, and 11B. The partition 165 is made of, for example, an organic insulating material such as polyimide and acrylic.

The hydrophobic insulating film 162 is made of a material exhibiting hydrophobicity (water repellency) with respect to the polar liquid 164 (in the strict sense, exhibiting affinity for the nonpolar liquid 163 under no electric field), and also having a property excellent in terms of electrical insulation. Specific examples of the material include polyvinylidene fluoride (PVdF) as well as polytetrafluoroethylene (PTFE) which are fluorine-based polymers, and silicone.

The nonpolar liquid 163 is a liquid material having almost no polarity and exhibiting electrical insulation, and exhibits non-transparency (does not exhibit optical transparency). Examples suitable for the nonpolar liquid 163 include colored oil (silicon oil and the like), in addition to hydrocarbon-based materials such as decane, dodecane, hexadecane, and undecane.

The polar liquid 164 is a liquid material having polarity, and exhibits transparency (optical transparency). Examples suitable for the polar liquid 164 include water, and a solution in which an electrolyte such as potassium chloride and sodium chloride is dissolved. Here, when a voltage is applied to this polar liquid 164, wettability (a contact angle between the polar liquid 164 and the inner surface) for the hydrophobic insulating film 162 (an inner surface of the partition 165) changes greatly as compared with the nonpolar liquid 163.

The sealing substrate 55 is a substrate (a cover glass or the like) provided to seal the entire display panel 10B, and is made of a transparent substrate.

[Functions and Effects of Display Panel 10B]

Figure 14:
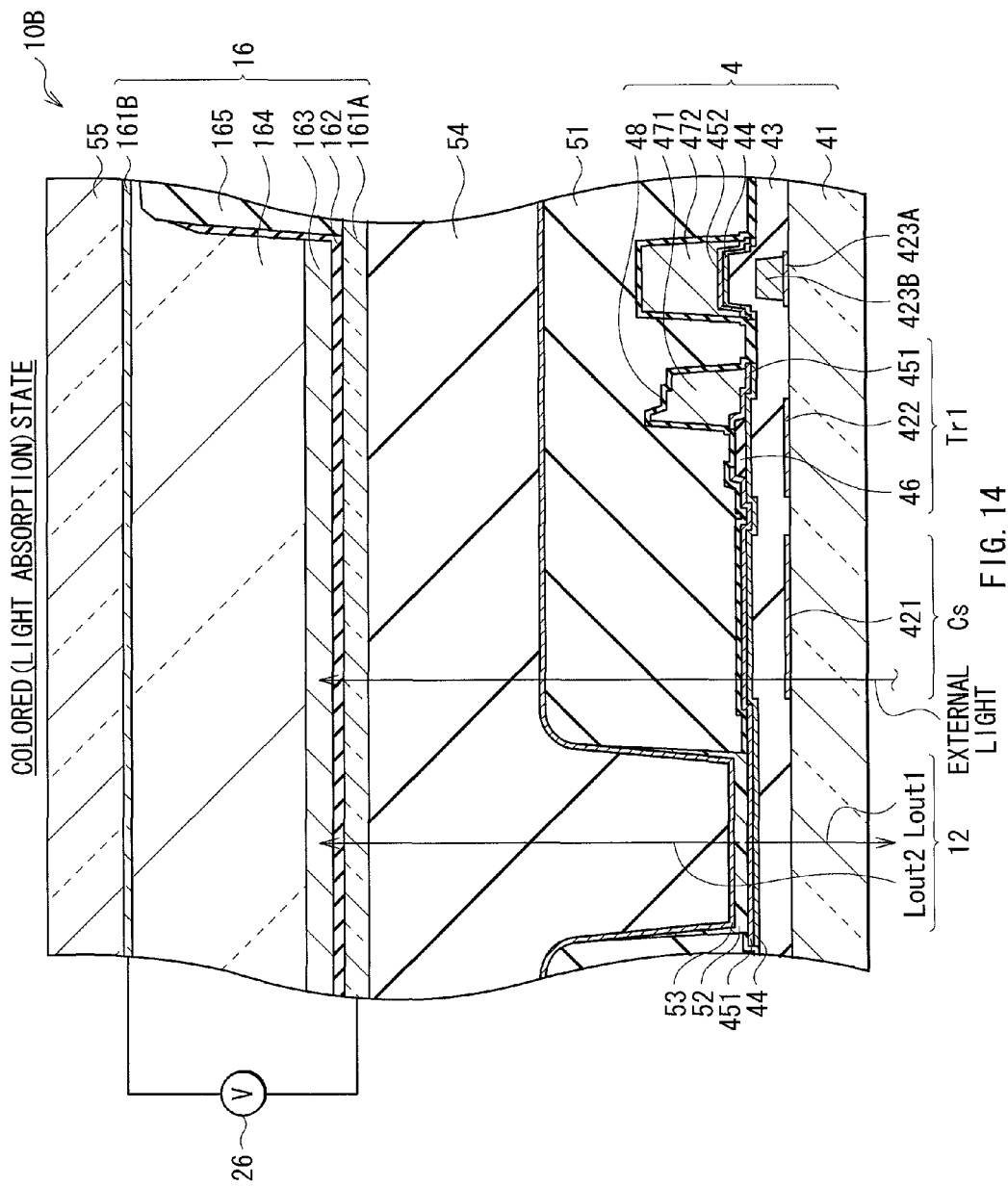
FIG. 14 is a schematic cross-sectional diagram for description of a light absorption state in a transmittance control device illustrated in FIG. 13.

In this transmittance control device 16, when a drive voltage Vd3 is not applied between the transparent electrodes 161A and 161B, an interface between the nonpolar liquid 163 and the polar liquid 164 is flat, as illustrated in FIG. 14. For this reason, the nonpolar liquid 163 exhibiting the non-transparency is provided over the whole of each of the subpixels 11R, 11G, and 11B. As a result, the transmittance control device 16 as a whole does not exhibit optical transparency, and light including emission light Lout2 and external light is not allowed to pass therethrough (a colored (light absorption) state).

Figure 15:
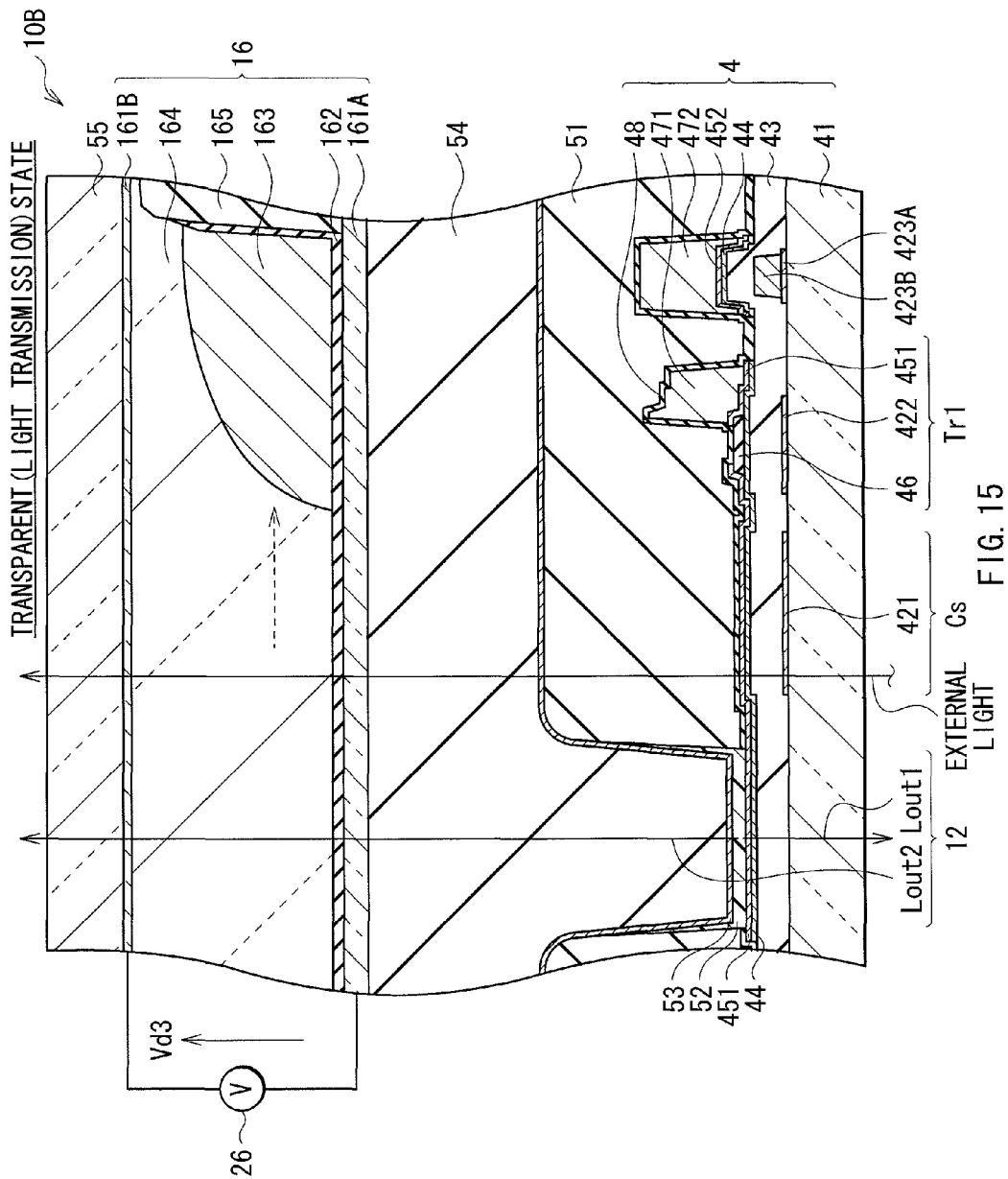
FIG. 15 is a schematic cross-sectional diagram for description of a light transmission state in a transmittance control device illustrated in FIG. 13.

On the other hand, as illustrated in FIG. 15, when the drive voltage Vd3 is applied between the transparent electrodes 161A and 161B, the wettability of the polar liquid 164 changes greatly as compared with the nonpolar liquid 163 as described above, and the interface between the nonpolar liquid 163 and the polar liquid 164 takes a shape protruding towards the rear-face side. For this reason, the nonpolar liquid 163 exhibiting the non-transparency is disposed only at a part of each of the subpixels 11R, 11G, and 11B (see an arrow indicated by a broken line in FIG. 15). As a result, the transmittance control device 16 as a whole exhibits the optical transparency, and the light including the emission light Lout2 and the external light is allowed to pass therethrough (a transparent (light transmission) state).

In this way, the transmittance control device 16 is allowed to switch the operation between the incident-light (the light including the emission light Lout2 and the external light) transmission operation and the incident-light absorption operation, depending on the presence or absence of the application of the drive voltage Vd3. In the present embodiment therefore, the switching control between the transmission operation and the absorption operation is performed, at the time of each of the light emission and the non-light emission of the organic EL device 12.

Thus, in the present embodiment, at the time of the light emission and at the time of the non-light emission in each of the subpixels 11R, 11G, and 11B (the organic EL device 12) in a pixel 11, the respective visual recognition states become, for example, similar to those illustrated in FIGS. 9A to 9D in the first embodiment, depending on the combination of a light transmission state and a light absorption state in the transmittance control device 16 described above.

As a result, similar effects by similar function to those of the first embodiment are obtained in the present embodiment as well. In other words, visibility in the display 1 with the pixels each having a light-transmission region is enhanced (for example, visibility in displaying information is also enhanced while securing visibility on the back-surface side). Therefore, when this display 1 is used as a display for AR, for example, the presence is improved.

In addition, in the present embodiment, the transmittance control device 16 is configured using the electrowetting device and thus, a response speed is made relatively high.

It is to be noted that the present embodiment has been described for the case where the electrowetting device capable of switching the operation between the incident-light transmission operation and the incident-light absorption operation is used as the transmittance control device 16, although it is not limited thereto. Alternatively, for example, an electrowetting device capable of switching the operation between incident-light transmission operation and incident-light reflection operation may be used as the transmittance control device.

[Modifications]

Next, modifications (modifications 1 to 4) common to the first to third embodiments will be described. It is to be noted that the same elements as those of each of the embodiments will be provided with the same characters as those of each of the embodiments, and the description will be omitted as appropriate.

[Modification 1]

Figure 16A:
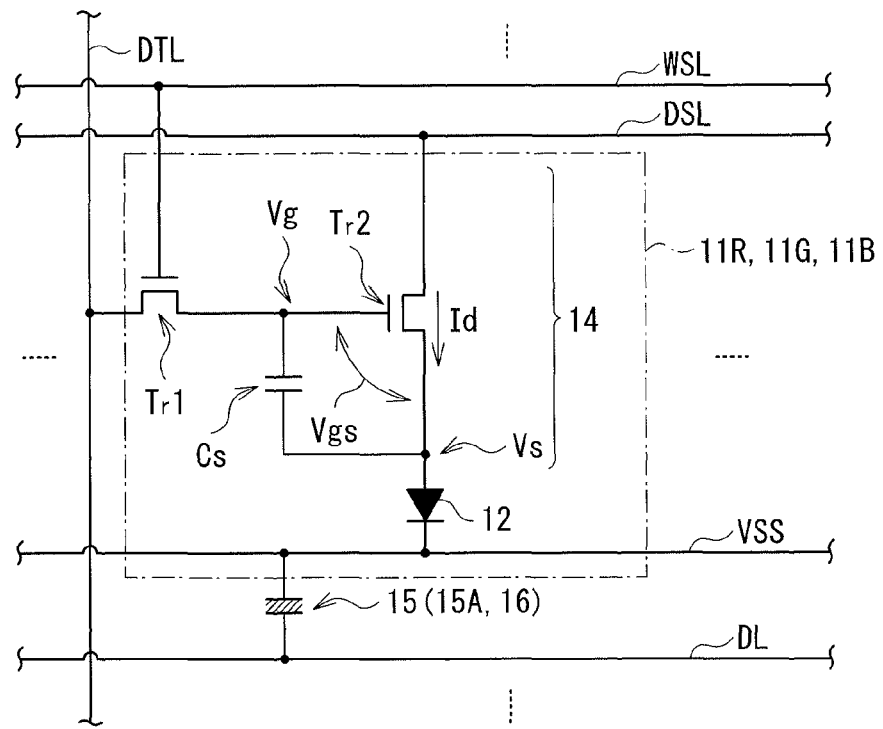
FIGS. 16A and 16B are circuit diagrams each illustrating an internal configuration example of each subpixel, together with a transmittance control device, according to modifications 1 and 2, respectively.

FIG. 16A illustrates an internal configuration example (a circuit configuration example) of each of the subpixels (the subpixels 11R, 11G, and 11B) according to a modification 1, together with the transmittance control device 15 (or the transmittance control device 15A or 16). In the present modification, unlike each of the embodiments, the transmittance control device 15 is disposed as one for every plurality of pixels 11. Here, in particular, the transmittance control device 15 is disposed for every horizontal line.

Specifically, here, between the transmittance control device 15 and the organic EL device 12, at least one electrode (here, the fixed potential line VSS forming the cathode electrode) is made common thereto. However, the electrode between the transmittance control device 15 and the organic EL device 12 may not be provided as a common electrode, when the transmittance control device 15 is disposed for every horizontal line. It is to be noted that DL in the figure indicates a drive wire of the transmittance control device 15.

Figure 17A:
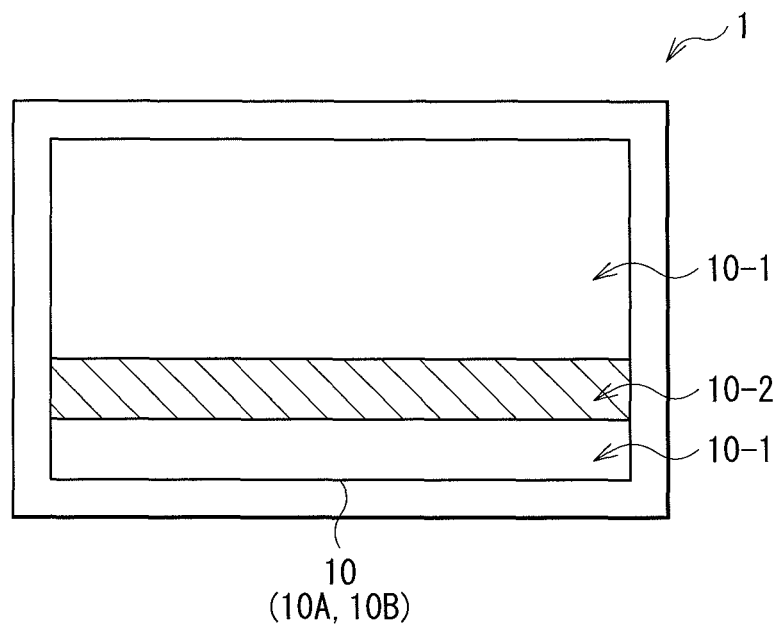
FIGS. 17A and 17B are schematic diagrams each illustrating an arrangement example of a transparent region and a non-transparent region in a display panel, according to the modifications 1 and 2, respectively.

In the present modification, such a configuration allows a transparent region (a light-transmission region) 10-1 and a non-transparent region (a non-light-transmission region) 10-2 for every horizontal line to be formed in the display panel 10, 10A, or 10B, depending on the application in the AR use, as illustrated in FIG. 17A, for example. In addition, using a cathode wire as the electrode of the transmittance control device 15 reduces the number of wires, thereby simplifying the drive circuit. It is to be noted that, for instance, the transmittance control device 15 may be disposed for every vertical line, instead of every horizontal line.

[Modification 2]

Figure 16B:
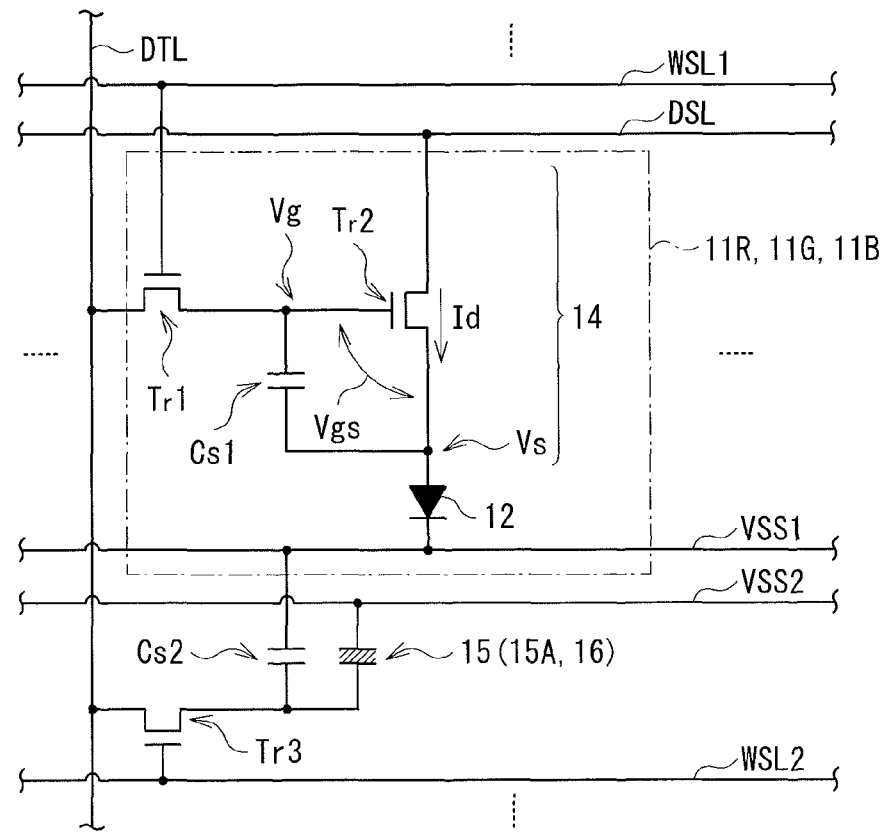

FIG. 16B illustrates an internal configuration example (a circuit configuration example) of each of the subpixels (the subpixels 11R, 11G, and 11B) according to a modification 2, together with the transmittance control device 15. In the present modification, the transmittance control device 15 is provided for every subpixel (pixel), unlike each of the embodiments and the modification 1.

Specifically, here, between the transmittance control device 15 and the organic EL device 12, at least one electrode (here, the fixed potential line VSS forming the cathode electrode) is made common thereto. However, the electrode between the transmittance control device 15 and the organic EL device 12 may not be provided as a common electrode, when the transmittance control device 15 is disposed for every subpixel. In addition, here, a transistor (a selection transistor) Tr3 and a scanning line WSL2 are provided to drive the transmittance control device 15 selectively for each of the subpixels 11R, 11G, and 11B. Also, a retention capacitive element Cs2 is provided to retain an electric potential between both ends of the transmittance control device 15. It is to be noted each of VSS1 and VSS2 in FIG. 16B is a fixed potential line.

Figure 17B:
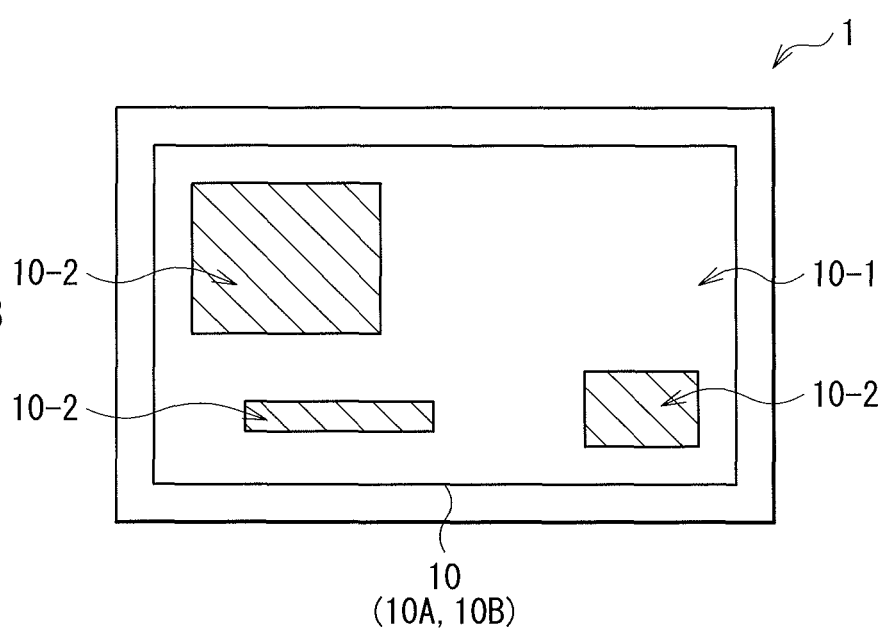

Therefore, in the present modification, the transparent region 10-1 and the non-transparent region 10-2 are realized by the subpixel (pixel) in the display panel 10, 10A, or 10B, depending on the application in the AR use, for instance, as illustrated in FIG. 17B, for example. Specifically, for example, displaying an emphasized outline region of a letter is possible. In addition, the number of wires is reduced by using the cathode wire as the electrode shared with the transmittance control device 15, and thereby the drive circuit is simplified.

[Modifications 3 and 4]

Figure 18A:
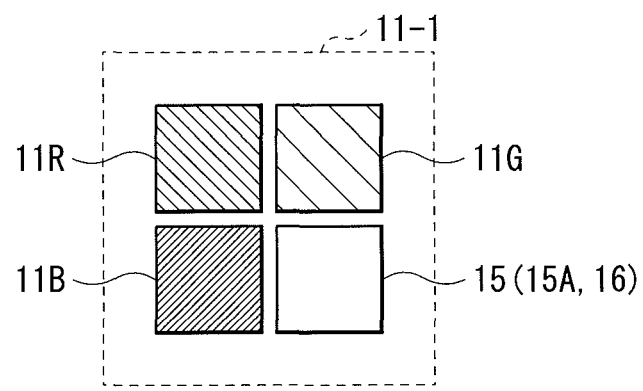
FIGS. 18A and 18B are schematic diagrams each illustrating a subpixel configuration example in each pixel, according to modifications 3 and 4, respectively.
Figure 18B:
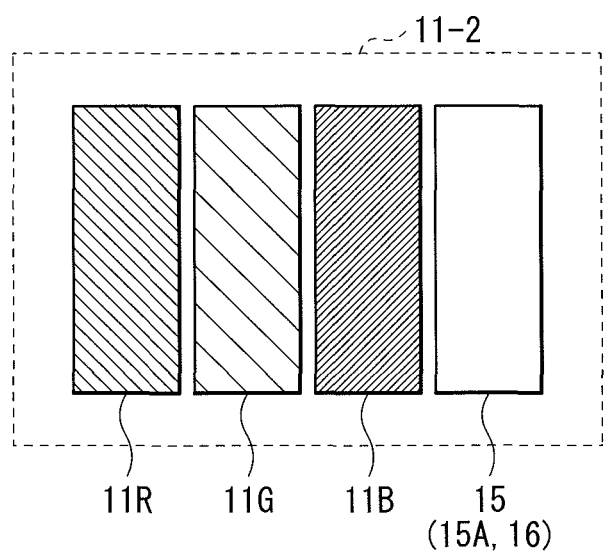
Figure 19A:
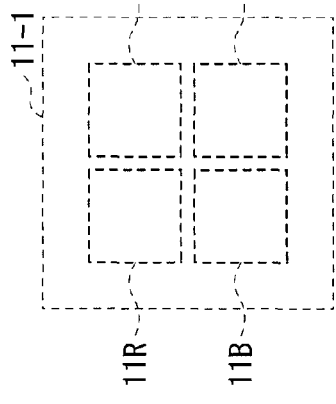
FIGS. 19A to 19D are plan views schematically illustrating visual recognition states at the time of light emission and at the time of non-light emission in the pixel of the modification 3.
Figure 19B:
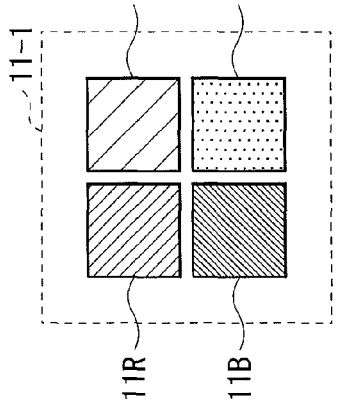
Figure 19C:
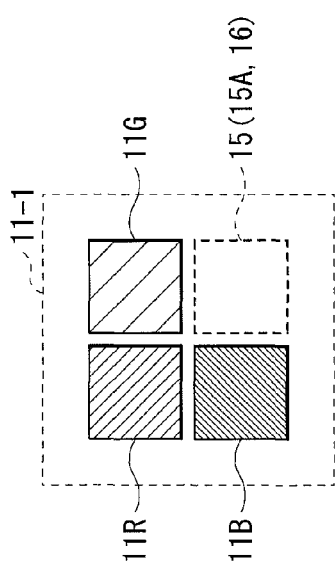
Figure 19D:
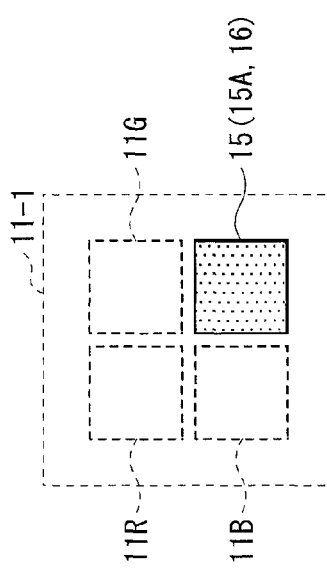

FIGS. 18A and 18B are plan views each schematically illustrating an internal configuration (a subpixel configuration) example of each pixel (pixels 11-1 and 11-2), according to modifications 3 and 4, respectively. In each of the respective pixels 11-1 and 11-2 of the modifications 3 and 4, the transmittance control device 15 is disposed side by side with the subpixels 11R, 11G, and 11B, unlike the pixels 11 and 11A of the embodiments.

Specifically, in the pixel 11-1 of the modification 3 illustrated in FIG. 18A, the three subpixels 11R, 11G, and 11B and the one transmittance control device 15 are disposed in a matrix (2×2 in columns and rows) in each of the pixels 11-1.

In the pixel 11-2 of the modification 4 illustrated in FIG. 18B, the three subpixels 11R, 11G, and 11B and the one transmittance control device 15 are aligned along a horizontal-line direction in each of the pixels 11-2.

It is to be noted that the subpixels 11R, 11G, and 11B and the transmittance control device 15 are allowed to share a part of the electrodes, and be formed using ink jet printing, flexographic printing, or the like.

In these modifications 3 and 4, the above-described configurations allow the visual recognition state at the time of each of the light emission and the non-light emission in the pixels 11-1 and 11-2 to be obtained, as represented by the modification 3 illustrated in FIGS. 19A to 19D, for example. In other words, at the time of each of the light emission and the non-light emission in each of the subpixels 11R, 11G, and 11B (the organic EL device 12) in the pixel 11-1, the visual recognition states similar to those of the embodiments are achieved, depending on the combination of the light transmission state and the light absorption state (or the light reflection state) in the transmittance control device 15.

Therefore, similar effects by similar function to those of the embodiments are obtained in the modifications 3 and 4 as well. In other words, the visibility in the display 1 with the pixels each having the light-transmission region is enhanced. Therefore, when this display 1 is used as a display for AR, for instance, the presence is improved.

Module and Application Examples

With reference to FIG. 20 to FIG. 25G, application examples of the display 1 in each of the embodiments and the modifications will be described below. The display 1 in each of the embodiments and the modifications may be applied to electronic units in all fields, which display externally-input image signals or internally-generated image signals as still or moving images. The electronic units include television receivers, digital cameras, laptop computers, portable terminals such as portable telephones, video cameras, and the like.

(Module)

Figure 20:
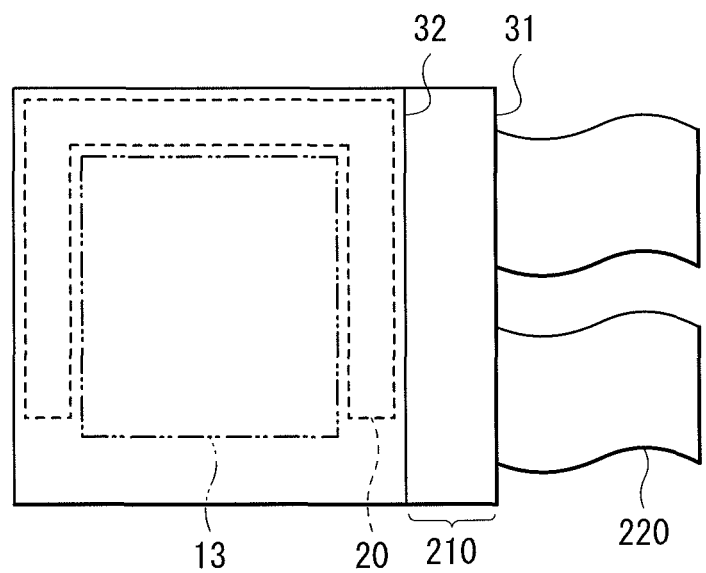
FIG. 20 is a plan view illustrating a schematic configuration of a module including the display in each of the embodiments and the modifications.

For instance, the display 1 is incorporated into any of various kinds of electronic units such as application examples 1 to 5 which will be described later, as a module illustrated in FIG. 20. This module is formed, for example, by providing a region 210 exposed at one side of a substrate 31 from a sealing substrate 32. In this exposed region 210, an external connection terminal (not illustrated) is formed by extending wires of the drive circuit 20. This external connection terminal may be provided with a flexible printed circuit (FPC) 220 for input and output of signals.

Application Example 1

Figure 21:
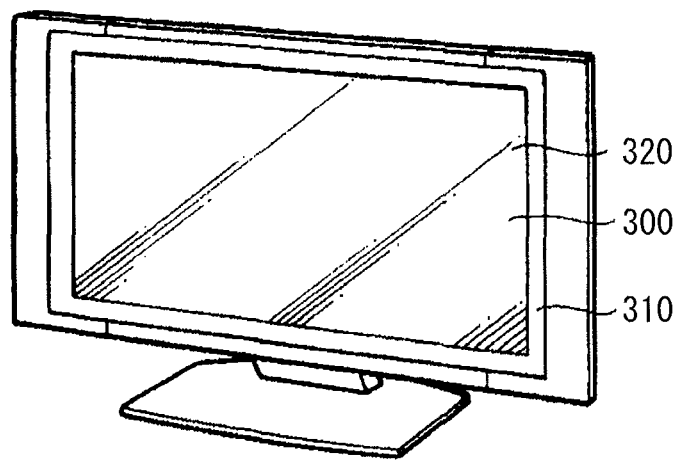
FIG. 21 is a perspective diagram illustrating an external view of an application example 1 of the display in each of the embodiments and the modifications.

FIG. 21 illustrates an external view of a television receiver to which the display 1 is applied. This television receiver has, for example, an image-display screen section 300 that includes a front panel 310 and a filter glass 320. The image-display screen section 300 is configured using the display 1.

Application Example 2

Figure 22A:
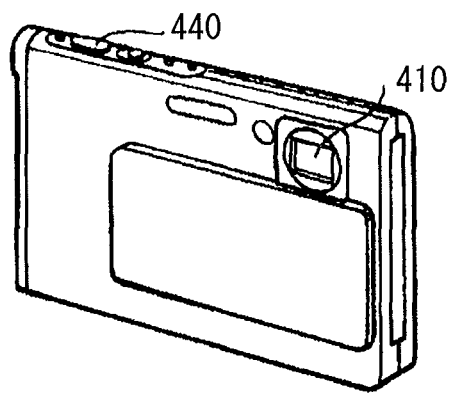
FIGS. 22A and 22B are perspective diagrams illustrating an external view of an application example 2 when viewed from front and an external view of the same when viewed from back, respectively.
Figure 22B:
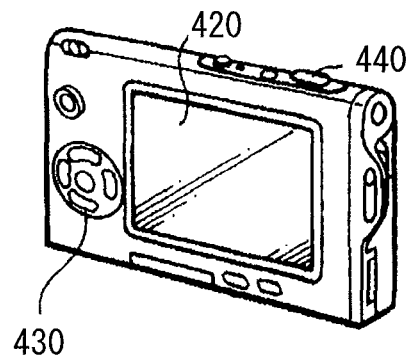

FIGS. 22A and 22B each illustrate an external view of a digital camera to which the display 1 is applied. This digital camera includes, for example, a flash emitting section 410, a display section 420, a menu switch 430, and a shutter release 440. The display section 420 is configured using the display 1.

Application Example 3

Figure 23:
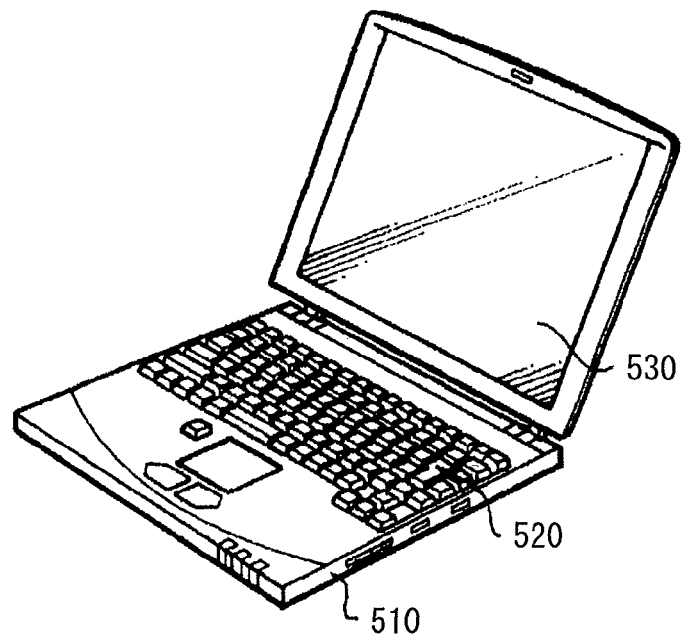
FIG. 23 is a perspective diagram illustrating an external view of an application example 3.

FIG. 23 illustrates an external view of a laptop computer to which the display 1 is applied. This laptop computer includes, for example, a main section 510, a keyboard 520 for entering characters and the like, and a display section 530 displaying an image. The display section 530 is configured using the display 1.

Application Example 4

Figure 24:
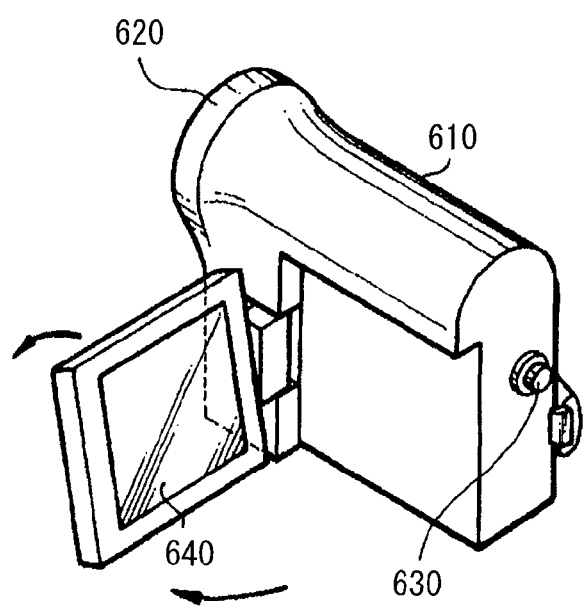
FIG. 24 is a perspective diagram illustrating an external view of an application example 4.

FIG. 24 illustrates an external view of a video camera to which the display 1 is applied. This video camera includes, for example, a main section 610, a lens 620 disposed on a front face of this main section 610 to shoot an image of a subject, a start/stop switch 630 in shooting, and a display section 640. The display section 640 is configured using the display 1.

Application Example 5

FIGS. 25A to 25G illustrate external views of a portable telephone to which the display 1 is applied. This portable telephone is, for example, a unit in which an upper housing 710 and a lower housing 720 are connected by a coupling section (a hinge section) 730, and includes a display 740, a sub-display 750, a picture light 760, and a camera 770. The display 740 or the sub-display 750 is configured using the display 1.

The technology of the present disclosure has been described with reference to the embodiments, the modifications, and the application examples, but is not limited to these embodiments, modifications, and application examples, and may be variously modified.

For example, in the embodiments, the modifications, and the application examples, the description has been provided with reference to the case where the electrochromic device or the electrowetting device is used as an example of the transmittance control device, although it is not limited thereto. The transmittance control device may be configured using other types of device. In addition, in the embodiments, the modifications, and the application examples, the organic EL device is used an example of the light-emission device, but a light-emission device other than the organic EL device (e.g., an inorganic EL device, LED (Light Emitting Diode), and the like) may be used.

Further, in the embodiments, the modifications, and the application examples, the description has been provided by taking the display panel of the so-called bottom emission type as an example, although it is not limited thereto. The display panel may be of a so-called top emission type.

Furthermore, in the embodiments, the modifications, and the application examples, the description has been provided with reference to the case where the light transmittance is controlled in (switched between) two stages (transmission or non-transmission) in the transmittance control device, although it is not limited thereto. The light transmittance may be controlled in (switched between) multiple stages.

In addition, in the embodiments, the modifications, and the application examples, the description has been provided with reference to the case where the display 1 is of the active matrix type. However, the configuration of the pixel circuit 14 provided for the active matrix driving is not limited to those described for the embodiments, the modifications, and the application examples. In other words, the configuration of the pixel circuit 14 is not limited to the "2Tr1C" circuit configuration described for the embodiments, the modifications, and the application examples. For instance, a capacitive element, a transistor, and the like may be added to the pixel circuit 14 or provided as a substitution, as necessary. In that case, a necessary drive circuit other than the scanning-line drive circuit 23, the signal-line drive circuit 24, and the power-line drive circuit 25 may be added according to a change of the pixel circuit 14.

Further, in the embodiments, the modifications, and the application examples, the description has been provided with reference to the case where the timing generation circuit 22 controls the drive operation in the scanning-line drive circuit 23, the signal-line drive circuit 24, the power-line drive circuit 25, and the control-device drive circuit 26. However, the drive operation of these circuits may controlled by other circuit. Furthermore, control of the scanning-line drive circuit 23, the signal-line drive circuit 24, the power-line drive circuit 25, and the control-device drive circuit 26 may be performed by hardware (a circuit) or software (a program).

Moreover, in the embodiments, the modifications, and the application examples, the description has been provided with reference to the case where each of the write transistor Tr1, the drive transistor Tr2, and the like is formed of the n-channel transistor (e.g., the TFT of the n-channel MOS type), although it is not limited thereto. In other words, each of the write transistor Tr1, the drive transistor Tr2, and the like may be formed of a p-channel transistor (e.g., a TFT of a p-channel MOS type).

The present technology may be configured as follows.

(1) A display including:
a plurality of pixels each including a light-emission device, and having a light-transmission region in at least a part thereof; and
one or more transmittance control devices capable of controlling a transmittance of incident light.

(2) The display according to (1), wherein the transmittance control device is capable of switching operation between incident-light transmission operation and incident-light absorption operation or reflection operation.

(3) The display according to (2), wherein the transmittance control device is capable of switching the operation between the transmission operation and the absorption operation or the reflection operation, at a time of each of light emission and non-light emission of the light-emission device.

(4) The display according to any one of (1) to (3), wherein the one or more transmittance control devices are disposed to face the light-emission devices.

(5) The display according to any one of (1) to (3), wherein the one or more transmittance control devices are disposed side by side with the light-emission devices.

(6) The display according to any one of (1) to (5), wherein the transmittance control device is disposed for every plurality of the pixels.

(7) The display according to (6), wherein the transmittance control device is provided as being common to all the pixels.
(8) The display according to (6), wherein the transmittance control device is disposed for every horizontal line or every vertical line.
(9) The display according to any one of (1) to (5), wherein the transmittance control device is disposed for each of the pixels.
(10) The display according to any one of (1) to (9), wherein one or more electrodes are made common between the transmittance control device and the light-emission device.
(11) The display according to any one of (1) to (10), wherein the transmittance control device is an electrochromic device or an electrowetting device.
(12) The display according to any one of (1) to (11), wherein
the pixels each include a pixel circuit, the pixel circuit including the light-emission device and a drive device, and
at least a part of a semiconductor layer and an electrode layer of the drive device as well as a wiring layer is configured using a light transmissive material, in the pixel circuit.
(13) The display according to any one of (1) to (12), wherein the light-emission device is an organic EL device.
(14) An electronic unit including a display, the display including:
a plurality of pixels each including a light-emission device, and having a light-transmission region in at least a part thereof; and
one or more transmittance control devices capable of controlling a transmittance of incident light.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A display comprising:
a plurality of pixels, each pixel of the plurality of pixels including a light-emission device and a transparent region; and
one or more transmittance control devices located at a back-surface side of the display, the one or more transmittance control devices configured to control a transmittance of external light incident on the one or more transmittance control devices and emission light incident on the one or more transmittance control devices from the light-emission device,
wherein the one or more transmittance control devices prevent the external light and the emission light from passing through the one or more transmittance control devices when the one or more transmittance control devices are in an incident-light absorption operating mode or an incident light reflection operating mode, and
wherein the one or more transmittance control devices pass the external light and the emission light when the one or more transmittance control devices are in an incident-light transmission operating mode.

2. The display according to claim 1, wherein the one or more transmittance control devices are capable of switching an operating mode between an incident-light transmission operating mode and incident-light absorption operating mode or reflection operating mode.

3. The display according to claim 2, wherein the one or more transmittance control devices are capable of switching the operating mode between the incident-light transmission operating mode and the incident-light absorption operating mode or the incident light reflection operating mode, at a time of each of light emission and non-light emission of the light-emission device.

4. The display according to claim 1, wherein the one or more transmittance control devices face the light-emission devices.

5. The display according to claim 1, wherein the one or more transmittance control devices are disposed side by side with the light-emission devices.

6. The display according to claim 1, wherein the one or more transmittance control devices are provided for every pixel of the plurality of the pixels.

7. The display according to claim 6, wherein the one or more transmittance control devices are provided as being common to all the pixels of the plurality of pixels.

8. The display according to claim 6, wherein the one or more transmittance control devices are provided for at least one of every horizontal line or every vertical line of the display.

9. The display according to claim 1, wherein the one or more transmittance control device are provided for each of the pixels of the plurality of pixels.

10. The display according to claim 1, wherein one or more electrodes are made common between the one or more transmittance control devices and the light-emission device.

11. The display according to claim 1, wherein the one or more transmittance control devices include at least one of an electrochromic device and an electrowetting device.

12. The display according to claim 1, wherein each pixel of the plurality of pixels include a pixel circuit, the pixel circuit including the light-emission device and a drive device, and
wherein at least a part of a semiconductor layer, an electrode layer of the drive device, and a wiring layer is includes a light transmissive material, within the pixel circuit.

13. The display according to claim 1, wherein the light-emission device is an organic electroluminescence (EL) device.

14. An electronic unit including a display, the display comprising:
a plurality of pixels, each pixel of the plurality of pixels including a light-emission device and a transparent region; and
one or more transmittance control devices located at a back-surface side of the display, the one or more transmittance control devices configured to control a transmittance of external light incident on the one or more transmittance control devices and emission light incident on the one or more transmittance control devices from the light-emission device,
wherein the one or more transmittance control devices prevent the external light and the emission light from passing through the one or more transmittance control devices when the one or more transmittance control devices are in an incident-light absorption operating mode or an incident light reflection operating mode, and
wherein the one or more transmittance control devices pass the external light and the emission light when the one or more transmittance control devices are in an incident-light transmission operating mode.

15. The display according to claim 1, wherein the light-emission device is between the one or more transmittance control devices and a substrate of the display.

16. The electronic unit according to claim 14, wherein the one or more transmittance control devices are capable of switching an operating mode between an incident-light transmission operating mode and incident-light absorption operating mode or reflection operating mode.

17. The electronic unit according to claim 16, wherein the one or more transmittance control devices are capable of switching the operating mode between the incident-light transmission operating mode and the incident-light absorption operating mode or the incident light reflection operating mode, at a time of each of light-emission and non-light emission of the light-emission device.

18. The electronic unit according to claim 14, wherein the one or more transmittance control devices face the light-emission devices.

19. The electronic unit according to claim 14, wherein the one or more transmittance control devices are disposed side by side with the light-emission devices.

20. The electronic unit according to claim 14, wherein each pixel of the plurality of pixels include a pixel circuit, the pixel circuit including the light-emission device and a drive device, and wherein the light-emission device is located between the one or more transmittance control devices and a substrate of the display.

* * * * *